(12) United States Patent
Tervaluoto et al.

(10) Patent No.: US 7,336,937 B2
(45) Date of Patent: Feb. 26, 2008

(54) COMPENSATION OF A DC OFFSET IN A RECEIVER

(75) Inventors: Jussi Tervaluoto, Oulu (FI); Antti Ruha, Oulu (FI); Joni Jäntti, Oulu (FI)

(73) Assignee: Nokia Corporation, Espoo (FI)

( * ) Notice: Subject to any disclaimer, the term of this patent is extended or adjusted under 35 U.S.C. 154(b) by 364 days.

(21) Appl. No.: 10/839,725

(22) Filed: May 5, 2004

(65) Prior Publication Data

US 2005/0250459 A1    Nov. 10, 2005

(51) Int. Cl.
    *H04B 1/06* (2006.01)
(52) U.S. Cl. .............................. 455/232.1; 455/234.1; 455/324; 455/296
(58) Field of Classification Search .. 455/232.1–253.2, 455/324, 303, 296, 334, 226.1, 226.2, 226.3, 455/226.4; 375/341, 345
    See application file for complete search history.

(56) References Cited

U.S. PATENT DOCUMENTS

| | | | |
|---|---|---|---|
| 5,422,889 A | | 6/1995 | Sevenhans et al. |
| 6,246,717 B1 * | | 6/2001 | Chen et al. ................. 375/345 |
| 6,327,313 B1 | | 12/2001 | Traylor et al. |
| 6,560,447 B2 | | 5/2003 | Rahman et al. |
| 6,560,448 B1 * | | 5/2003 | Baldwin et al. ......... 455/234.1 |
| 6,625,232 B1 | | 9/2003 | Tilley |
| 6,633,618 B1 | | 10/2003 | Kuiri et al. |
| 6,671,334 B1 * | | 12/2003 | Kuntz et al. ................. 375/345 |
| 6,735,422 B1 * | | 5/2004 | Baldwin et al. ............. 455/324 |
| 6,763,228 B2 * | | 7/2004 | Prentice et al. .......... 455/234.1 |
| 6,943,803 B1 * | | 9/2005 | Cosman et al. .......... 455/232.1 |
| 2002/0151289 A1 * | | 10/2002 | Rahman et al. .......... 455/232.1 |
| 2004/0218696 A1 * | | 11/2004 | Suissa et al. ................ 375/341 |
| 2005/0105596 A1 * | | 5/2005 | Fan et al. .................... 375/147 |
| 2006/0003787 A1 * | | 1/2006 | Heo et al. ................. 455/232.1 |
| 2006/0135111 A1 * | | 6/2006 | Jensen ......................... 455/334 |

OTHER PUBLICATIONS

A. A. Abidi, "Direct-Conversion Radio Transceivers for Digital Communications," IEEE Journal of Solid-State Circuits, vol. 30, No. 12, Dec. 1995, pp. 1399-1410.
A. Bateman, D. Haines and R. Wilkinson, University of Bristol, United Kingdom, "Direct Conversion Linear Transceiver Design," pp. 53-56.

* cited by examiner

*Primary Examiner*—Lana Le
(74) *Attorney, Agent, or Firm*—Ware, Fressola, Van Der Sluys & Adolphson, LLP

(57) ABSTRACT

A method of compensating a direct-current offset coupled into a receiving path of a receiver, the receiving path having at least one gain factor adjustable by a gain control, which method first determines an amount of a direct-current offset present at a selected end point in the receiving path. A compensation quantity is set accordingly. In case of a forthcoming adjustment of the at least one gain factor by the gain control, the compensation quantity is then scaled with a scaling factor to prevent a direct-current step at the selected end point due to this forthcoming adjustment. The final compensation quantity is fed at a selected summing node into the receiving path. The invention is also directed to a corresponding receiver, an electronic device comprising such a receiver, a hardware component for such a receiver and to a corresponding software program product.

25 Claims, 15 Drawing Sheets

COMPENSATION OF A DC OFFSET IN A RECEIVER

FIELD OF THE INVENTION

The invention relates to a method of compensating a direct current offset coupled into a receiving path of a receiver, wherein in the receiving path at least one gain factor is adjustable by a gain control. The invention relates equally to a corresponding receiver, to an electronic device comprising such a receiver, to a hardware component for such a receiver and to a software program product for such a receiver.

BACKGROUND OF THE INVENTION

A receiving path in which at least one gain factor is adjustable by a gain control is well known, for example as a receiving path of a direct conversion receiver.

For illustration, a block diagram of an exemplary analog direct conversion receiver 10 is presented as FIG. 1.

The depicted receiver 10 comprises a low noise amplifier (LNA) 11 for amplifying received radio frequency (RF) signals, mixers 12 for down-converting the amplified RF signals, an analog signal processing component 13 for processing the down-converted signals, analog-to-digital converters (ADC) 14 for converting the processed analog signals into digital signals, and a digital signal processing component (DSP) 15 for a further processing of the digital signals. For processing the analog down-converted signal, the analog signal processing component 13 comprises an Nth-order low-pass filter (LPF), an automatic gain control (AGC), a direct-current (DC) offset cancellation, etc. For processing the digital signal, the DSP 15 comprises a decimation stage, an LPF, etc. The output of the DSP 15 constitutes the digital baseband (BB) output.

Implementing a receiver with a direct conversion architecture has the advantage that it is cheaper than other conversion architectures, like super-heterodyne architectures, since expensive band pass filter components for an intermediate frequency (IF) are not required in a direct conversion. Moreover, the receiver can be realized as a system on chip (SoC) solution, that is, the components of the receiver can be implemented on a single chip.

The receiver 10 can be integrated for example in a mobile terminal 16 for receiving and processing RF signals transmitted by a mobile communication network.

One known problem of direct conversion receivers is the direct current (DC) offset in the base-band. In the case of a relatively high DC offset and of a high signal gain, the base-band signal may be forced out of a desired voltage range, become distorted or even be clipped.

FIG. 2 is a schematic circuit diagram of a straightforward implementation of the front end of the receiver of FIG. 1, in which possible RF coupling paths that can convert to a DC offset in the baseband are indicated. For reasons of clarity, only one of an I branch and a Q branch is illustrated. The circuit of FIG. 2 comprises an RF amplifier 21 with the LNA 11, a Gilbert cell 22 as mixers 12, and two LPF stages 25, 27 as analog baseband filter of the analog signal processing component 13. Instead of the depicted second order LPF 25, 27, a higher order LPF can be used as well.

The LNA 11 comprises two input terminals and two outputs terminals. The LNA 11 amplifies received RF signals RFin and outputs the amplified signals as voltages Urf+ and Urf−. The outputs terminals of the LNA 11 are connected to two signal input terminals of a down-conversion mixing component 23 of the Gilbert cell 22. The mixing component 23 receives via two additional input terminals alternating local oscillator signals LO+ and LO−, which enable a down-conversion of input radio frequency signals RFin. The resulting baseband signals are output as voltages Ubb+ and Ubb− via a respective output terminal.

The first output terminal of the mixing component 23 is connected via a first input terminal of the first LPF stage 25 and a resistor R1a to a first input of an operational amplifier 26 of the first LPF stage 25, and a first output of operational amplifier 26 is connected to a first output terminal of the first LPF stage 25. A capacitor C1a on the one hand and a resistor R2a on the other hand are arranged in parallel to each other between the first input and the first output of the operational amplifier 26.

The second output terminal of the mixing component 23 is connected via a second input terminal of the first LPF stage 25 and a resistor R1b to a second input of the operational amplifier 26, and a second output of the operational amplifier 26 is connected to a second output terminal of the first LPF stage 25. A capacitor C1b on the one hand and a resistor R2b on the other hand are arranged in parallel to each other between the second input and the second output of the operational amplifier 26.

The first output terminal of the first LPF stage 25 is connected via a first input terminal of the second LPF stage 27 and a resistor R3a to a first input of an operational amplifier 28 of the second LPF stage 27, and a first output of the operational amplifier 28 is connected to a first output terminal of the second LPF stage 27. A capacitor C2a on the one hand and a resistor R4a on the other hand are arranged in parallel to each other between the first input and the first output of the operational amplifier 28.

The second output terminal of the first LPF stage 25 is connected via a second input terminal of the second LPF stage 27 and a resistor R3b to a second input of the operational amplifier 28, and a second output of the operational amplifier 28 is connected to a second output terminal of the second LPF stage 27. A capacitor C2b on the one hand and a resistor R4b on the other hand are arranged in parallel to each other between the first input and the first output of the operational amplifier 28.

The two LPF stages 25, 27 apply a second order low pass filtering on the baseband signals Ubb+ and Ubb− received from the Gilbert mixer 22. The resulting low-pass filtered baseband signals are forwarded to the analog-to-digital converters 14 of FIG. 1.

In the receiver front end of FIG. 2, a DC offset at the output of the second LPF stage 27 may be created by several mechanisms. A DC offset may be created for instance by a local oscillator signal feed-through to the RF port of the mixing component 23. This coupling path is indicted by an arrow labeled "I". Alternatively or additionally, a DC offset may be created by a local oscillator signal feed-through to the RF port of the LNA 11 and by a subsequent down-conversion to DC. This coupling path is indicted by an arrow labeled "II". Alternatively or additionally, a DC offset may be created by an intermodulation of an interferer in adjacent channels, due to the non-linearity (IIP2, IIP3) of the LNA 11 and the Gilbert mixer 22 to DC. This coupling path is indicted by an arrow labeled "III". Even though not indicated in the Figure, also the baseband filter blocks 25, 27 may contribute to the DC offset with their own contribution.

Altogether, the receiver may suffer from a DC offset caused by several sources. The signals from each source are amplified in the receiver path and contribute to the total DC offset of the receiver. FIG. 3 is a simplified model of the DC offset coupling and contribution to the output of the receiver path. In this model, the frequency conversion is omitted and all signals are presented as baseband equivalent signals for the sake of simplicity.

The model comprises a first summing node 31, to which the desired baseband equivalent signal RFin_eq and in addition a first equivalent disturbing DC signal Uo1 are fed. The baseband equivalent signal RFin_eq corresponds in a real system to the received radio frequency signal RFin. The signal Uo1 corresponds in a real system to a harmful RF signal, which appears as DC signal in the baseband. The output of the first summing node 31 is connected via a gain with a gain factor of A1, which is a property of the LNA 11 and the mixer 22, to a second summing node 32. A second equivalent disturbing DC signal Uo2 is equally fed to the second summing node 32. The signal Uo2 corresponds in a real system to a harmful RF signal, which appears as DC signal in the baseband. The output of the second summing node 32 is connected via a gain with a gain factor of A2, applied by the first LPF stage 25, to a third summing node 33. A third disturbing DC signal Uo3 is equally fed to the third summing node 33. The output of the third summing node 33 is connected via a gain with a gain factor of A3, applied by the second LPF stage 27, to the analog-to-digital converters 14.

The total DC offset Uoffset_out resulting at the output of the second LPF stage 27 is then given by the following equation:

$$U\text{offset\_out} = Uo1*A1*A2*A3 + Uo2*A2*A3 + Uo3*A3.$$

The total DC offset is thus influenced by changes in the different DC offset contributions and as well by gain changes. The DC offset contributions may vary on a sample-to-sample basis and may further depend on time, temperature, proximity, etc.

FIG. 4 is a schematic diagram illustrating a conventional DC compensation arrangement. The diagram comprises again the elements 31, 32, 33, A1, A2, A3 of the model of FIG. 3. The output of the second LPF stage 27 represented by the gain with a gain factor of A3 is connected in an analog feedback compensation loop via an integrator 41 and a summing device 42 to the second summing node 32.

In general, DC offset contributions of Uo1, Uo2 and Uo3 can thus be classified as those coupling in before the summing node 32 of the DC offset compensation, as those coupling in at the summing node 32 and those coupling in within the compensation loop, respectively. In practice, if the summing node 32 is at the mixer output, which is frequently the case, then DC contribution of Uo1 is subject to the LNA and mixer gain having a gain factor of A1 and its variations. Exemplary origins of Uo1 are local oscillator signal feed-through via the LNA 11 and/or mixer non-linearity. DC contribution Uo2 is present at the summing node 32 and is independent of variations in the LNA gain An exemplary origin of Uo2 is the undesired local oscillator signal feed-through via the RF port of the mixers 22 and subsequent down-conversion to DC via the desired mixer action or undesired non-linearity. DC contribution Uo3 occurs within the compensation loop, for example the DC offset resulting at the second filter stage 27. Usually DC contributions Uo1 and Uo2 dominate.

The integrator 41 is used for estimating the DC offset at the output of the second LPF stage 27 by integrating the output signal over time. The integration result is then summed by the summing device 42 in opposite polarity to the second summing node 32 at the output of the mixers 12 represented by the gain with a gain factor of A1. The integration result could also be summed to another suitable node in the receiver path.

The corresponding frequency response equation indicating the DC offset created at the output is then given by:

$$U\_out\_dc = ((RFin\_eq + Uo1)*A1*A2*A3*s + Uo2*A2*A3s + Uo3*A3s)/(s + A2*A3)$$

The integration applied by the integrator 41 can be continuous, in particular in 3G (third generation) receivers, or synchronized, for instance to the frame rate of GSM (global system for mobile communications). The DC offset could also be estimated differently than by an integration, for example by a positive and negative peak detection, by envelope forming, by checking whether the output signal lies within a permitted range, etc.

As an alternative to the analog feedback loop, it is also known to measure the DC offset in the digital domain after the analog-to-digital converters 14 and to subtract the compensation signal either from an analogue summing node, for instance summing node 32, via a digital-to-analog converter, or from a digital signal in the digital domain. In practice, many solutions use both techniques in parallel, in particular by carrying out a coarse compensation in the analogue domain and a fine compensation in the digital domain. In FIG. 4, a dashed line indicates by way of example that a feedback signal from a digital loop may be connected to a further input of the summing device 42.

FIG. 5 is a schematic circuit diagram of the front end of a direct conversion receiver which is provided with an analog DC compensation loop. The receiver front end presented in FIG. 5 comprises the same elements as the receiver front end presented in FIG. 2. In addition, the first output of the second LPF stage 27 is connected via a resistor R5$a$ to a first input of an operational amplifier 51 and the second output of the second LPF stage 27 is connected via a resistor R5$b$ to a second input of the operational amplifier 51. A first output of the operational amplifier 51 is connected via a resistor R6$a$ in addition to the first input of the operational amplifier 26 of the first LPF stage 25. A second output of the operational amplifier 51 is connected via a resistor R6$b$ in addition to the second input of the operational amplifier 26. A capacitor C3$a$ is arranged between the first input and the first output of the operational amplifier 51, and a capacitor C3$b$ is arranged between the second input and the second output of the operational amplifier 51. The components 51, R5$a$, R5$b$, R6$a$, R6$b$, C3$a$, C3$b$ function as inverting integrator 52, which integrates the output of the second LPF stage 27 and which provide the inverted integration result to the input of the first LPF stage 25.

In conventional DC compensation approaches, however, two problems exist. Firstly, the frequency response may be a function of the gain setting. Secondly, every time one of the gain factors A1, A2, A3 is changed, a DC step is created. This results in contradictory requirements for the DC compensation loop. On the one hand, a fast compensation loop is preferred for enabling a fast settling due to the DC steps. On the other hand, a slow compensation loop is preferred in order to avoid an impairment, namely an attenuation, of the actually received signal. Such a prolonged DC settling can cause a momentary loss of received symbols and, ideally, should be avoided.

In order to reduce the negative effect of DC steps, a binary search, the use of faster time constants during settling, etc. have been proposed.

Also, from practical implementations of the DC offset compensation loop, it is known to use large off-chip capacitors in them.

SUMMARY OF THE INVENTION

It is an object of the invention to improve a DC offset compensation in a receiver. It is in particular an object of the invention to provide a possibility for preventing DC steps whenever an adjustable gain factor in the receiver is changed.

A method of compensating a direct-current offset coupled into a receiving path of a receiver is proposed. In the receiving path, at least one gain factor is adjustable by a gain control. The proposed method comprises determining an amount of a direct-current offset present at a selected end point in the receiving path and setting a compensation quantity accordingly. The proposed method further comprises, in case of a forthcoming adjustment of the at least one gain factor by the gain control, scaling the compensation quantity with a scaling factor to prevent a direct-current step at the selected end point due to the forthcoming adjustment of the at least one gain factor. The proposed method further comprises feeding the compensation quantity at a selected summing node into the receiving path.

Moreover, a receiver comprising a receiving path is proposed. In the receiving path, at least one gain factor is adjustable by a gain control, and a direct-current offset coupled into this receiving path is to be compensated. The proposed receiver comprises a DC estimation portion adapted to estimate an amount of a direct-current offset present at a selected end point in the receiving path. The DC estimation portion is moreover adapted to set a compensation quantity accordingly. The DC estimation portion is moreover adapted to scale the compensation quantity with a provided scaling factor, if any. The DC estimation portion is moreover adapted to feed the compensation quantity into the receiving path at a selected summing node. The proposed receiver further comprises a DC compensation control portion adapted to determine, in case of a forthcoming adjustment of the at least one gain factor, a scaling factor preventing a direct-current step at the selected end point due to the forthcoming adjustment of the at least one gain factor. The DC compensation control portion is moreover adapted to provide this scaling factor to the DC estimation portion.

In addition, an electronic device is proposed, which comprises such a receiver.

In addition, a hardware component for a receiver including a corresponding receiving path is proposed. The hardware component comprises a corresponding DC estimation portion and a corresponding DC compensation control portion as the proposed receiver.

Finally, a software program product is proposed in which a software code is stored which realizes the steps of the proposed method when running in a receiver.

It has to be noted that the direct-current offset may be a direct current offset and/or a direct-current voltage offset.

The invention proceeds from the idea that a feedback loop employed for compensating a DC offset in a receiving path can be supplemented by a scaling of a compensation quantity determined in the feedback loop. More specifically, a scaling can be performed each time a gain factor of the gain on the receiving path is to be adjusted. The scaling is performed such that a DC step due to the gain adjustment is prevented. Thus, the DC compensation is tied to the operation of the gain control.

It is an advantage of the invention that it enables a DC offset compensation without DC steps caused by gain steps in the receiver path. At the same time, the properties of a conventional DC compensation can be maintained. That is, under steady state conditions, the DC offset can be canceled after a sufficient period of time irrespective of the actual DC offset contributions. External capacitors are not required for preventing the DC step. Thereby, the component count is reduced and a large area consumption is avoided. Also the quality of the signal processing may be improved, as problems in soldering capacitors etc. are avoided. The implementation of the invention can be configured easily.

In one embodiment of the invention, the scaling factor is determined by first estimating a current amount of contributions to the direct-current offset. Then, a relative change in the direct-current offset is determined, which would have resulted with the estimated amount of direct-current contributions after a preceding gain adjustment. Finally, this relative change is selected as a scaling factor, as a similar relative change can be expected as well for the forthcoming gain adjustment.

In a further embodiment of the invention, the signal provided at the selected end point of the receiving path is normalized before it is used for determining the amount of a direct-current offset, in order to maintain a constant frequency response of the loop regardless of any changes in the gain factors. The signal is normalized more specifically by dividing it by a total gain applied by the receiving path between the summing node and the end point of the receiving path.

The amount of a direct-current offset at the end point of the receiving path can be determined in various ways. The determination can be based for example on an integration of a signal which is present at the end point of the receiving path. Moreover, it can be based on windowing a signal which is present at the end point of the receiving path, on detecting positive and negative peaks in this signal, and/or on an envelope forming of this signal. The invention can be used in particular in conjunction with a conventional digital DC compensation scheme, resulting in an increased settling speed and a greater accuracy despite of the AGC operation.

The employed time constants and operation characteristics can be implemented most efficiently in the digital domain and/or by software. This is particularly true for the DC offset estimation, for the scaling and for a possible normalization.

If the compensation quantity is determined and scaled in the digital or software domain, a respective final compensation quantity is converted into the analog domain before it is fed to the summing node.

The invention can be implemented in any receiver, in particular in any direct conversion receiver. The invention enables in particular an operation of a DC compensation and an AGC function in a direct conversion receiver without the DC steps at the base band which are usually associated with gain changes. This applies to gain changes in the base-band and as well to changes of a gain applied by an LNA.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
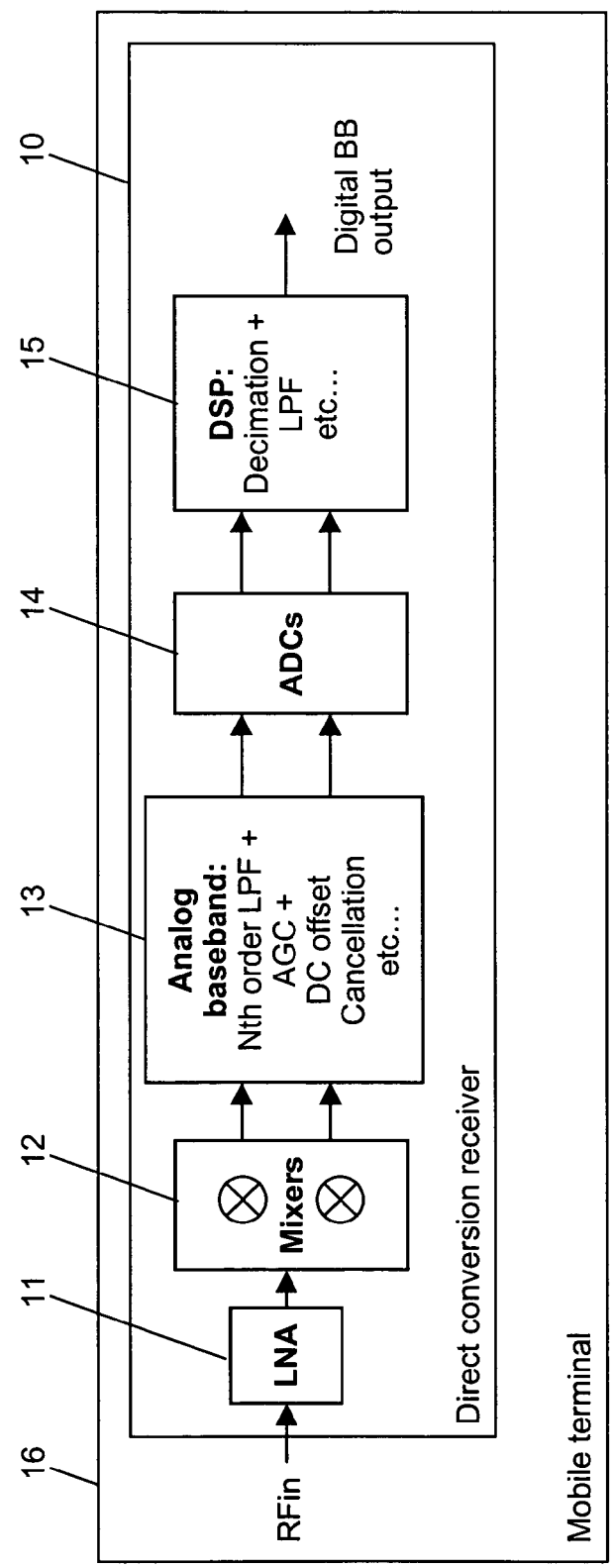
FIG. 1 is a schematic block diagram of a direct conversion radio frequency receiver.
Figure 2:
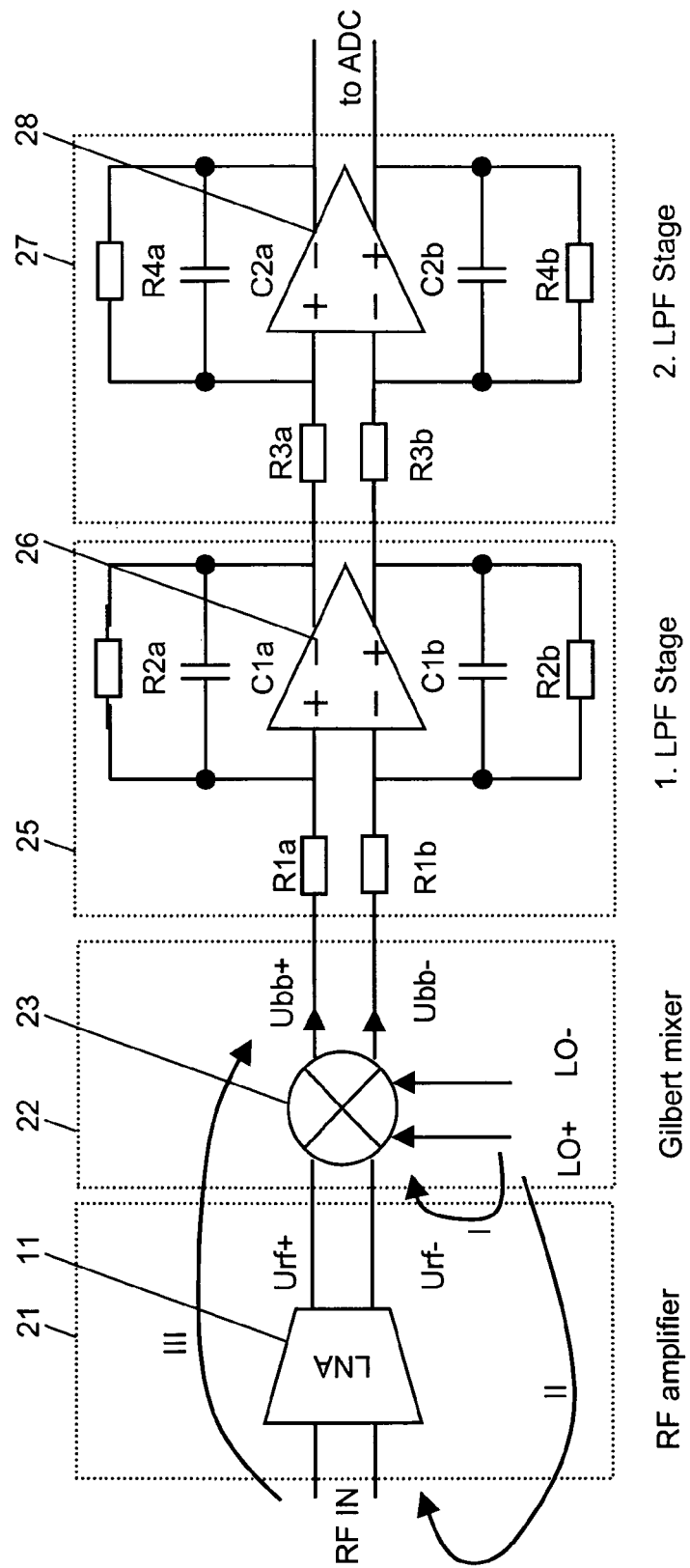
FIG. 2 is a schematic circuit diagram of one branch of a receiver front-end of a direct conversion radio frequency receiver, in which a coupling in of DC offset contributions is illustrated.
Figure 6:
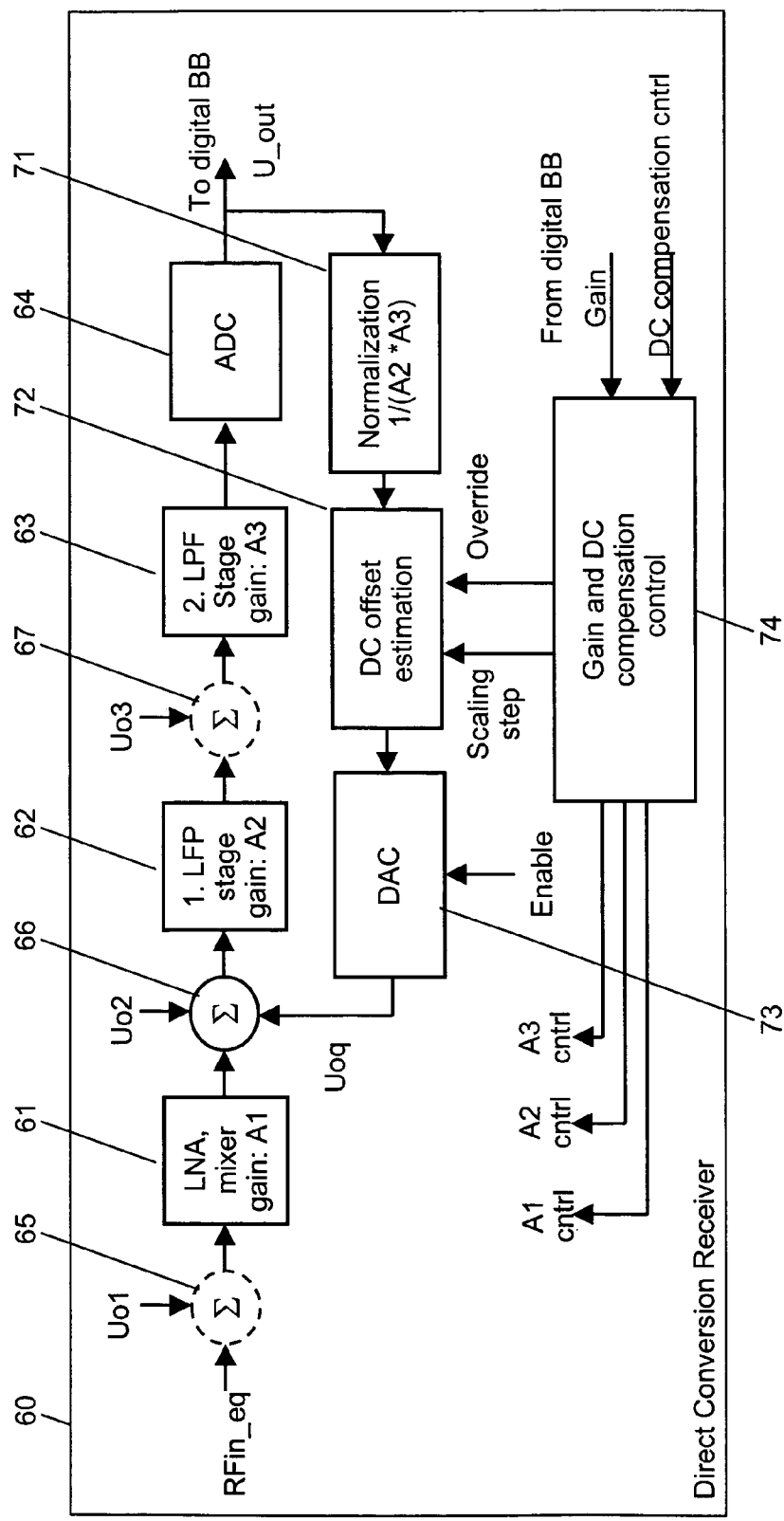
FIG. 6 is a schematic block diagram illustrating a DC compensation in a direct conversion radio frequency receiver according to an embodiment of the invention.

FIG. 6 is a schematic block diagram of a direct conversion receiver 60. The receiver 60 may correspond to the receiver 10 of FIG. 1, and the front-end of the receiver 60 may correspond to the receiver front-end schematically presented in FIG. 2, except that a DC offset cancellation according to an embodiment of the invention is implemented in addition. Only those components which are relevant for the invention are depicted.

Figure 3:
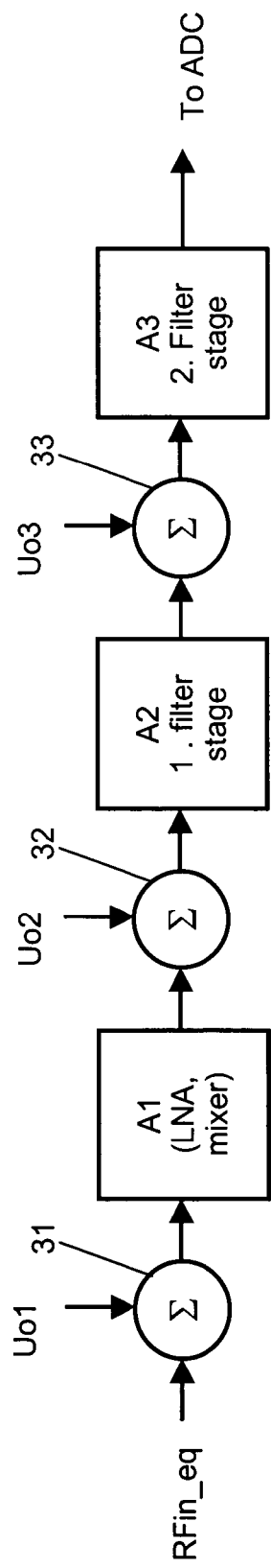
FIG. 3 is a model of DC offset contributions in a direct conversion radio frequency receiver.
Figure 4:
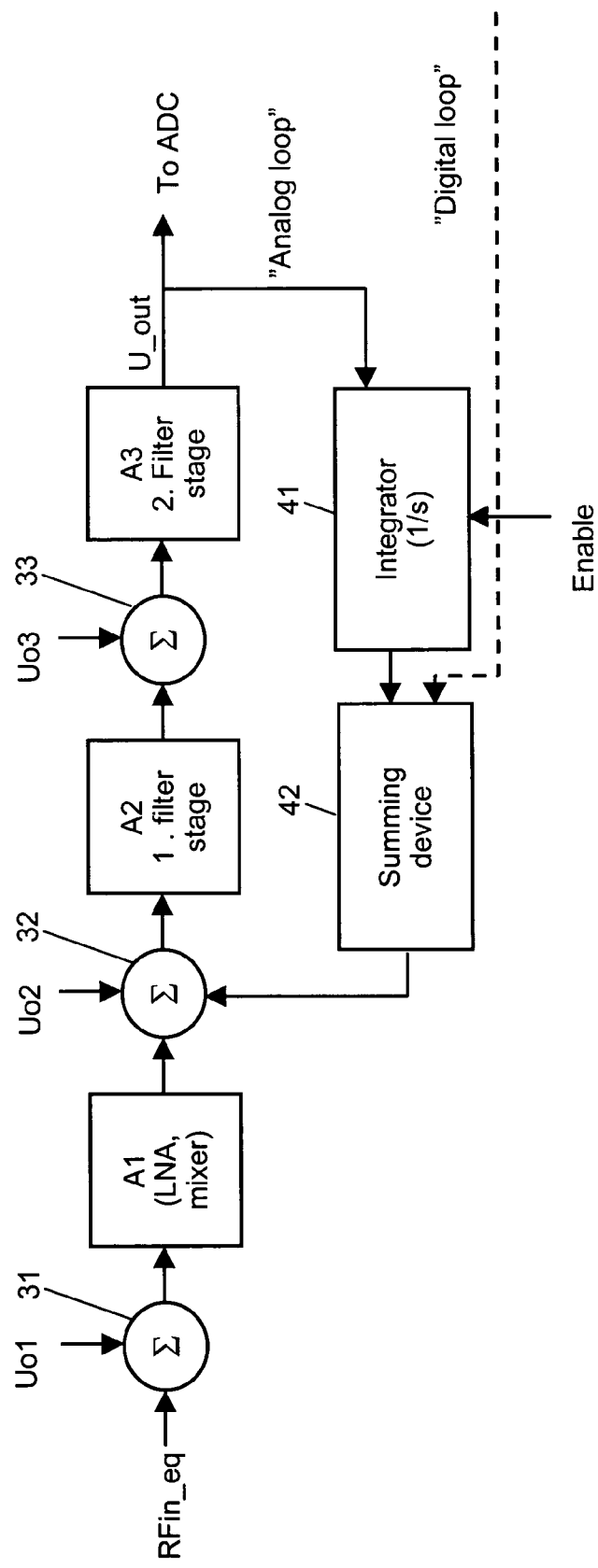
FIG. 4 is a schematic block diagram illustrating a conventional DC offset compensation based on the model of FIG. 3.
Figure 5:
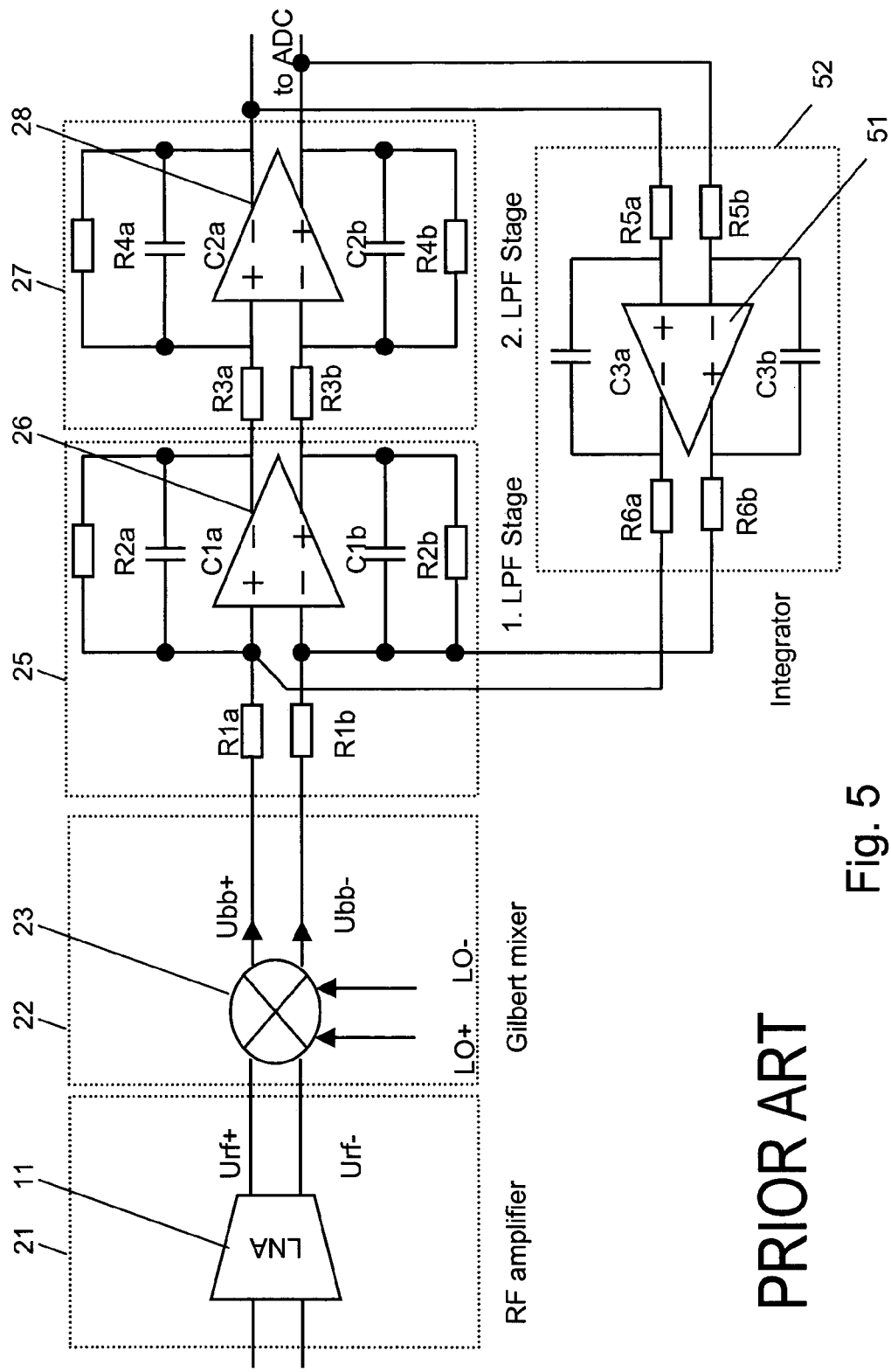
FIG. 5 is a schematic circuit diagram of a conventional analog DC compensation loop.

For the sake of simplicity, the frequency conversion is omitted and all signals are presented as baseband equivalent signals, similarly as in the model of FIG. 3.

The receiver 60 of FIG. 6 comprises a receiver path with an LNA and mixer portion 61, which is connected via a first LPF stage 62, a second LPF stage 63 and an analog-to-digital converter 64 to a digital baseband section of the receiver (not shown). The LNA and mixer portion 61 applies a gain with a gain factor of A1 to a baseband equivalent signal RFin_eq of an input RF signal. The first LPF stage 62 applies a gain with a gain factor of A2 to an input signal. The second LPF stage 63 applies a gain with a gain factor of A3 to an input signal. Each of the gain factors A1, A2 and A3 thus contributes to the total gain of the receiver path. In existing AGC solutions and receiver implementations, their values are known, as well as any changes.

With reference to the baseband equivalent model, an undesired DC offset contribution Uo1 can be introduced at the input of the LNA and mixer portion 61, as indicated by a first summing node 65. An undesired DC offset contribution Uo2 can further be introduced at the input of the first LPF stage 62, as indicated by a second summing node 66. An undesired DC offset contribution Uo3 can further be introduced at the input of the second LPF stage 63, as indicated by a third summing node 67. Thus, various DC offset contributions Uo1, Uo2, Uo3 of unknown value are weighted in the receiving path by known gain factors A1, A2 and A3, as described with reference to FIG. 3. Only the second summing node 66 represents a real component, therefore, the first and the second summing nodes 65, 67 are only circled by dashed lines.

It has to be noted that, similarly as in the model of FIG. 3, the signals Uo1 and Uo2 correspond in a real system to harmful RF signals due to receiver non-idealities, which appear as DC signals in the baseband. Signal Uo3 is a real DC offset component which contributes in the baseband to the total receiver DC offset.

For the DC offset cancellation, the output of the analog-to-digital converter 64 is connected in addition via a normalization portion 71, a DC estimation portion 72 and a digital-to-analog converter 73 to the second summing node 66.

Moreover, a gain and DC compensation control portion 74 has a controlling access to each of the gain factors A1, A2 and A3, as well as to the normalization portion 71 and to the DC estimation portion 72. The gain and DC compensation control portion 74 may form part of the DSP 15 depicted in FIG. 1 or receive information from the digital baseband portion of the receiver, for instance from the DSP 15.

The receiver path itself operates in a conventional manner, namely as described above with reference to FIG. 1.

Figure 7:
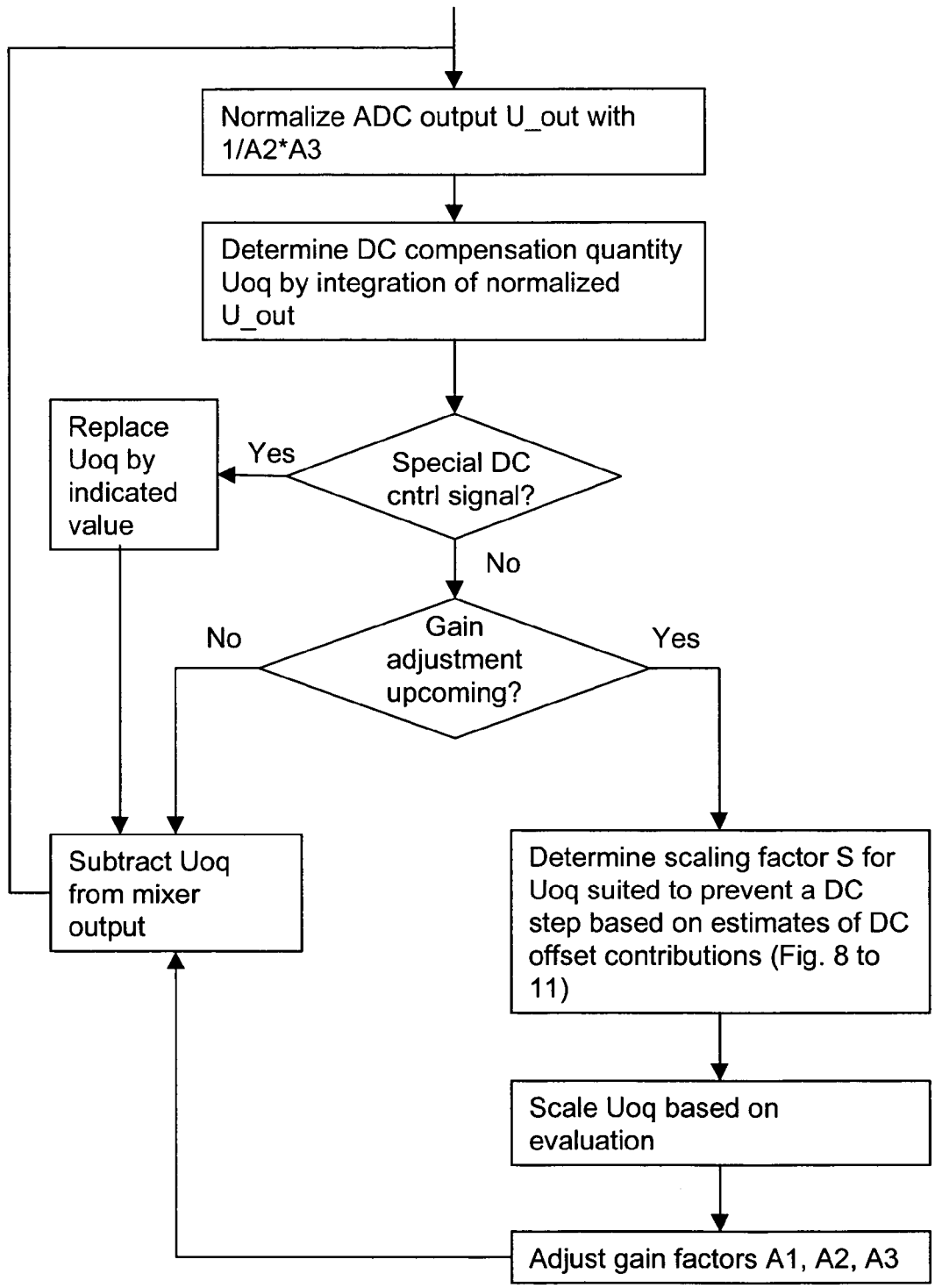
FIG. 7 is a flow chart illustrating the DC compensation in the receiver of FIG. 6.

The operation of the DC offset compensation according to the invention will now be described with reference to the flow chart of FIG. 7.

The digital signal U_out output by the analog-to-digital converter 64 is provided to the normalizing portion 71. The normalization portion 71 normalizes the output of the analog-to-digital converter 64 by a multiplication with 1/(A2*A3). This ensures that a constant frequency response of the loop is obtained regardless of the current values of the gain factors A1, A2 and A3.

The DC estimation portion 72 determines the amount of a direct current in the signal U_out by integrating the normalized signal provided by the normalization portion 71 in the time domain. The determined direct current is used as a compensation quantity Uoq. In steady state and a settled situation, the compensation quantity Uoq is given by:

$$Uoq = A1*Uo1 + Uo2 + 1/A2*Uo3.$$

The gain and DC compensation control portion 74 receives from the digital baseband information about the next gain adjustment which is to be performed. In addition, it may receive a specific DC compensation control signal.

When the gain and DC compensation control portion 74 receives from the digital base band section a specific DC compensation control signal, the determined compensation quantity Uoq is replaced by a compensation quantity Uoq comprised in the control signal by means of an "override"

signal provided to the DC estimation portion 72. Such an "override" signal may be used in particular for setting the DC offset compensation quantity to an initial value by bypassing the compensation loop during a power up period, for example by initializing it to zero or to some other desired value. This new compensation quantity Uoq is then converted by the digital-to-analog converter 73 into an analog direct current, which is subtracted from the output of the LNA and mixer portion 61 at summing node 66.

When no specific DC compensation control signal is provided and no adjustment of a gain factor A1, A2 or A3 is forthcoming, in contrast, the compensation quantity Uoq determined by the DC estimation portion 72 is converted by the digital-to-analog converter 73 into an analog direct current, which is then subtracted from the output of the LNA and mixer portion 61 at summing node 66. Thereby, the integrator 72 drives the DC offset at the output of the analog-to-digital converter 64 to zero.

The resulting frequency response indicating the DC offset created at the output will be $$U\_out\_dc=((RFin\_eq+Uo1)*A1*A2*A3*s+Uo2*A2*A3*s+Uo3*A3*s)/(s+1).$$

When the gain and DC compensation control portion 74 receives no specific DC compensation control signal from the digital base band, but a command to adjust at least one of the gain factors A1, A2, A3, it determines a scaling factor for the compensation quantity Uoq. The scaling factor is determined such that with the resulting compensation quantity Uoq, a DC step in the output U_out of the analog-to-digital converter 64 due to the change in gain is prevented. The determination of the scaling factor is based on estimates for the different offset contributions Uo1, Uo2 and Uo3 and will be explained in more detail further below with reference to FIGS. 8 to 11.

The gain and DC compensation control portion 74 then provides the scaling factor to the DC estimation portion 72. The DC estimation portion 72 scales the determined compensation quantity Uoq with this scaling factor.

The gain and DC compensation control portion 74 moreover changes the gain factor or factors A1, A2, A3 as required by supplying an A1 control signal, A2 control signal and/or A3 control signal to the portion 61, 62, 63 applying the respective gain. The scaled compensation quantity Uoq is then converted by the direct-to-analog converter 73 into an analog direct current, which is subtracted from the output of the LNA and mixer portion 61 at summing node 66 as DC offset compensation.

The digital-to-analog converter 73 may be provided in addition with an "enable" signal. Such an "enable" signal can be used to select between a continuous operation and a periodical operation of the DC compensation. For example, in WCDMA and CDMA, the loop may be set to operate continuously by setting the "enable" signal to "on", whereas in GSM, the loop may optionally be set to operate synchronously with the GSM frame rate. In the periodical mode, the loop is activated and deactivated by an alternating "enable" signal.

FIGS. 8 to 11 all present finite state machines which operate concurrently, and which have the purpose to scale the compensation quantity Uoq properly each time a gain change occurs.

In the final state machines of FIGS. 8 to 11, each change of gain factor A1 is indicated by dA1, while no change of gain factor A1 is indicated by XdA1, each change of gain factor A2 is indicated by dA2, while no change of gain factor A2 is indicated by XdA2, each change of gain factor A3 is indicated by dA3, while no change of gain factor A3 is indicated by XdA3.

A scaling factor which is suited to speed up the DC compensation settling can be determined based on the different DC offset contributions Uo1, Uo2 and Uo3 and on the different gain factors A1, A2, A3. While the gain factors and their changes are known, the DC offset contributions Uo1, Uo2 and Uo3 are not known in advance, and they may change during the operation due to a temporal evolution, due to a change in temperature, due to a change in proximity to disturbing sources, etc. Thus, they have to be estimated by the DC compensation control portion 74.

To this end, the DC offset estimation calculations are first initiated in the gain and DC compensation control portion 74. This is illustrated by the finite state machines of FIG. 8.

Figure 8:
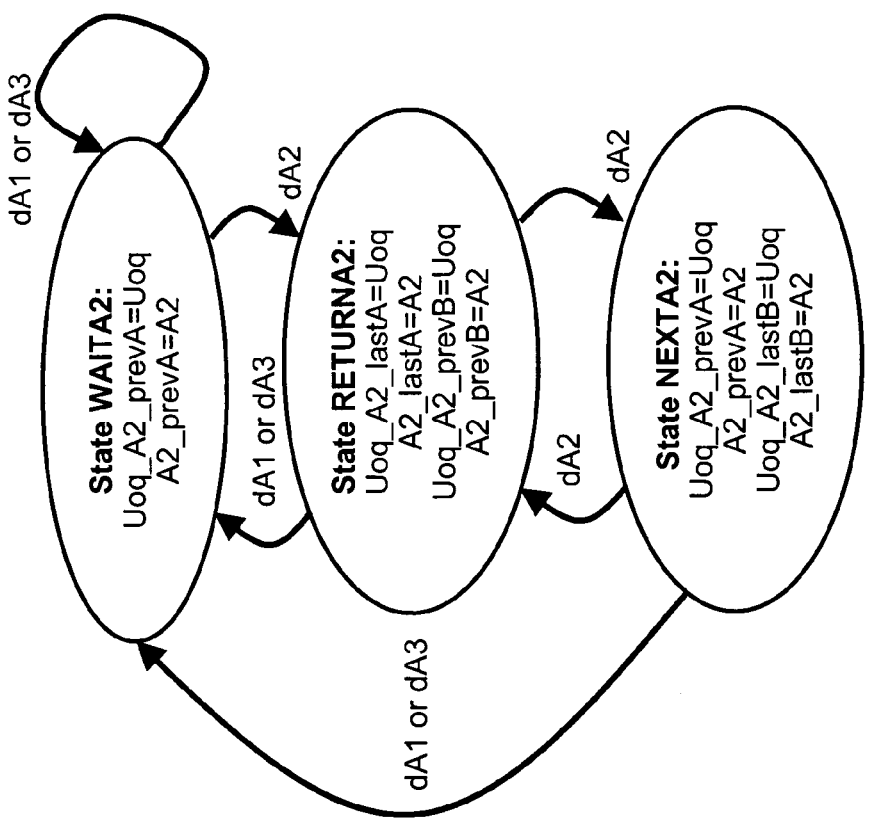
FIG. 8 is a finite state machine illustrating an initialization of the DC compensation in the receiver of FIG. 6.
Figure 8:
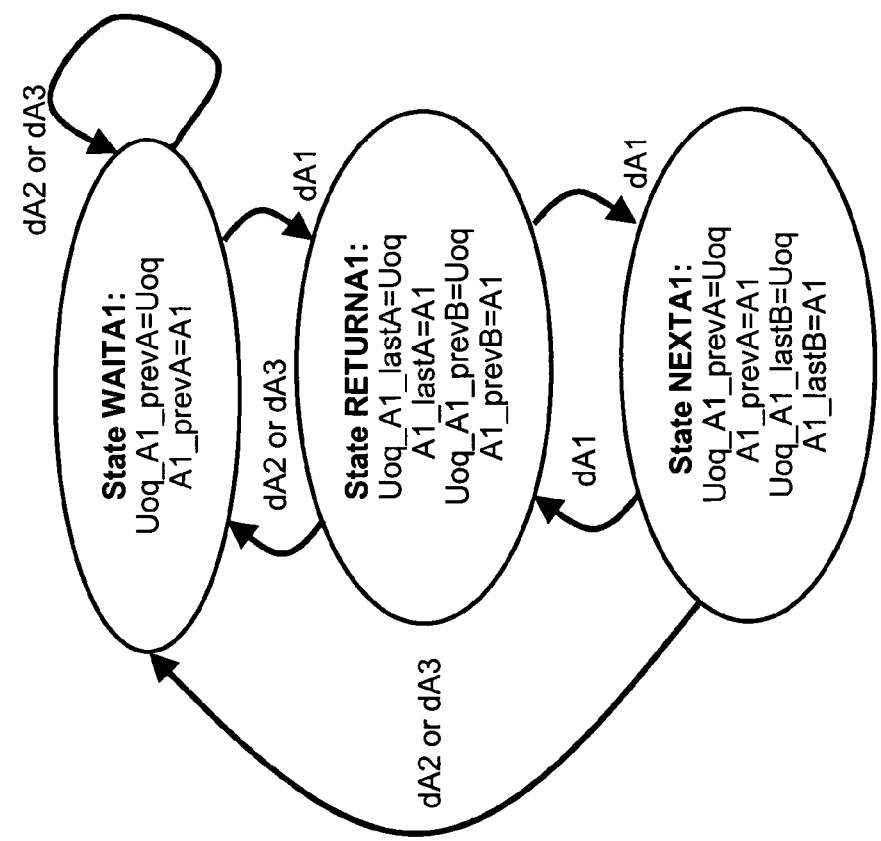

On the left hand side of FIG. 8, a finite state machine proceeds from a state WAITA1 to record values of the gain factor A1. This state is re-entered whenever one of gain factors A2 and A3 are to be changed. Upon each entry of the state WAITA1, a variable Uoq_A1_prevA is set to Uoq. Moreover, a variable A1_prevA is set to the value of gain factor A1 which is currently used. The variables Uoq_A1_prevA and A1_prevA are both stored in the gain and DC compensation control portion 74.

When the gain factor A1 is to be changed, a transition to a state RETURNA1 is caused. Upon each entry of this state, a variable Uoq_A1_lastA is set to Uoq. A variable A1_lastA is set to the value of gain factor A1 which is currently used. Further, a variable Uoq_A1_prevB is set to Uoq, and a variable A1_prevB is set to the value of gain factor A1 which is currently used. The variables Uoq_A1_lastA, A1_lastA, Uoq_A1_prevB and A1_prevB are equally stored in the gain and DC compensation control portion 74.

When the gain factor A1 is to be changed again, a transition to a state NEXTA1 is caused. Upon each entry of this state, the variable Uoq_A1_prevA is set to Uoq, and the variable A1_prevA is set to the value of gain factor A1 which is currently used. Further, a variable Uoq_A1_lastB is set to Uoq, and a variable A1_lastB is set to the value of gain factor A1 which is currently used. Also the variables Uoq_A1_lastB and A1_lastB are stored in the gain and DC compensation control portion 74.

When the gain factor A1 is to be changed again, a transition back to the state RETURNA1 is caused.

In both states, RETURNA1 and NEXTA1, a return to the state WAITA1 is caused, in case one of the gain factors A2 and A3 is to be changed.

Thus, before each change of one of the gain factors A1, A2, A3, the current values of the compensation quantity Uoq and of the gain factor A1 are stored, such that the last two values of gain factor A1 and the respectively associated values of the compensation quantity Uoq are always available.

On the right hand side of FIG. 8., a state machine proceeds from a state WAITA2 to record values of the gain factor A2. This state is re-entered whenever one of gain factors A1 and A3 are to be changed. Upon each entry of this state, a variable Uoq_A2_revA is set to Uoq. Moreover, a variable A2_prevA is set to the value of gain factor A2 which is currently used. Variables Uoq_A2_prevA and A2_prevA are both stored in the gain and DC compensation control portion 74.

When the gain factor A2 is to be changed, a transition to a state RETURNA2 is caused. Upon each entry of this state, a variable Uoq_A2_lastA is set to Uoq. A variable A2_lastA is set to the value of gain factor A2 which is currently used.

Further, a variable Uoq_A2_prevB is set to Uoq, and a variable A2_prevB is set to the value of gain factor A2 which is currently used. The variables Uoq_A2_lastA, A2_lastA, Uoq_A2_prevB and A2_prevB are equally stored in the gain and DC compensation control portion 74.

When the gain factor A2 is to be changed again, a transition to a state NEXTA2 is caused. Upon entry of this state, the variable Uoq_A2_prevA is set to Uoq, and the variable A2_prevA is set to the value of gain factor A2 which is currently used. Further, a variable Uoq_A2_lastB is set to Uoq, and a variable A2_lastB is set to the value of gain factor A2 which is currently used. Also the variables Uoq_A2_astB and A2_lastB are stored in the gain and DC compensation control portion 74.

When the gain factor A2 is to be changed again, a transition back to the state RETURNA1 is caused.

In both states, RETURNA2 and NEXTA2, a return to the state WAITA2 is caused, in case one of the gain factors A1 and A3 is to be changed.

Thus, before each change of one of the gain factors A1, A2, A3, the current values of the compensation quantity Uoq and of the gain factor A2 are stored, such that the last two values of gain factor A2 and the respectively associated values of the compensation quantity Uoq are always available.

Altogether, always four stored gain factors and four associated compensation quantities Uoq are available. For the gain factor A3, no values are stored, as a change of gain factor A3 does not cause any DC step due to the normalization.

The stored values of A1, A2 and Uoq are used for estimating the DC offset contributions Uo1, Uo2 and Uo3.

Figure 9:
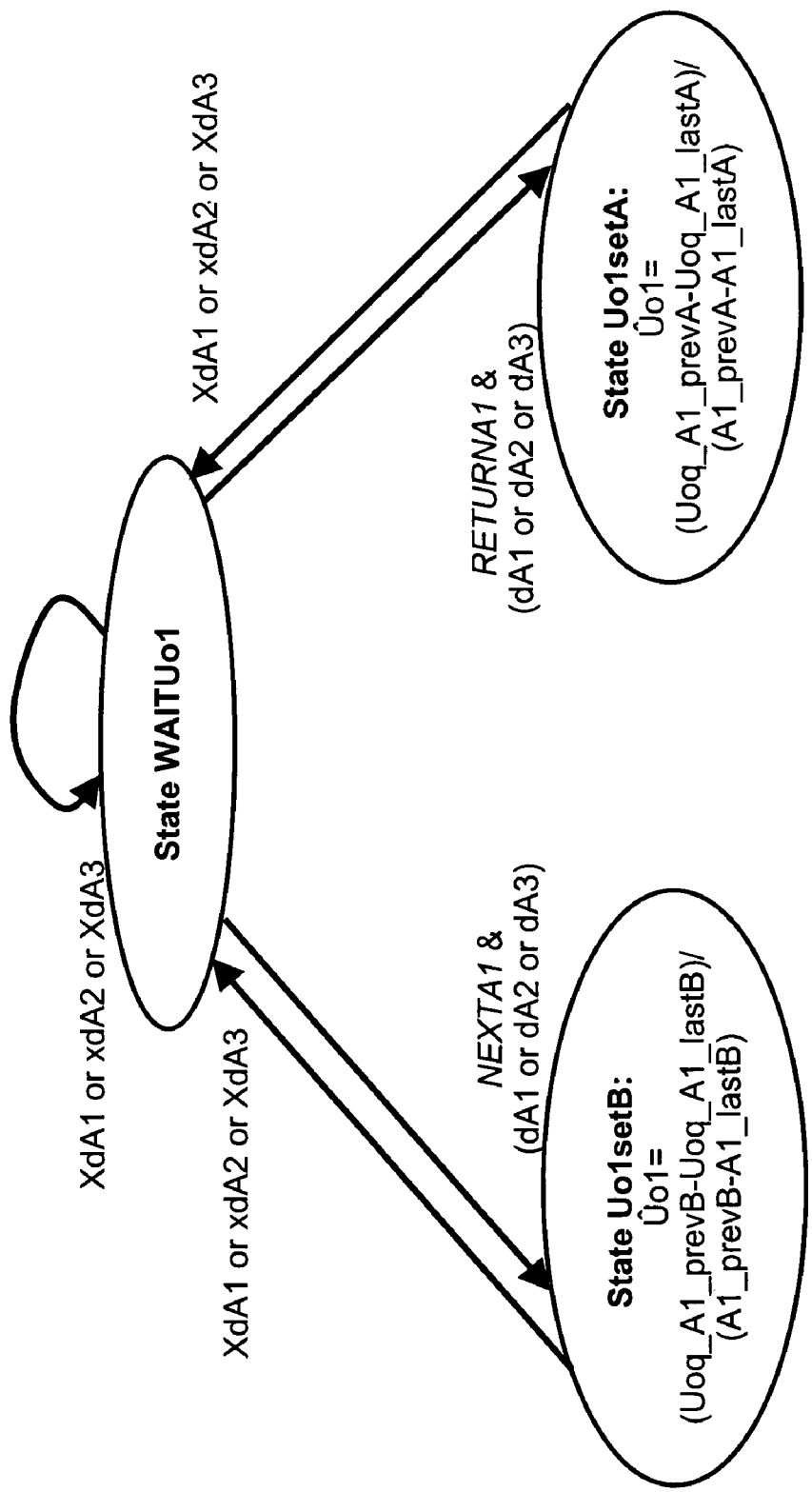
FIG. 9 is a finite state machine illustrating the determination of a first offset estimator in the receiver of FIG. 6.

FIG. 9 is a finite state machine illustrating the estimation of Uo1 in the gain and DC compensation control portion 74.

As long as none of the gain factors A1, A2 and A3 is to be changed, an estimation is not required and a state WAITUo1 is maintained.

As soon as the gain and DC compensation control portion 74 learns that one of the gain factors A1, A2, A3 is to be adjusted, it determines whether the initiation of the offset estimation calculations changed thereupon to state RETURNA1 or to state NEXTA1.

If the initiation entered the state RETURNA1, the DC offset contribution estimation for Uo1 enters the state Uo1setA. In this state, the offset contribution Uo1 is estimated to be:

$$\hat{U}o1=(Uoq\_A1\_prevA-Uoq\_A1\_lastA)/(A1\_prevA-A1\_lastA)$$

If the initiation entered the state NEXTA1, the DC offset contribution estimation for Uo1 enters the state Uo1setB. In this state, the offset contribution Uo1 is estimated to be:

$$\hat{U}o1=(Uoq\_A1\_prevB-Uoq\_A1\_lastB)/(A1\_prevB=A1\_lastB)$$

In both cases, the DC offset contribution estimation for Uo1 then returns to the state WAITUo1.

Figure 10:
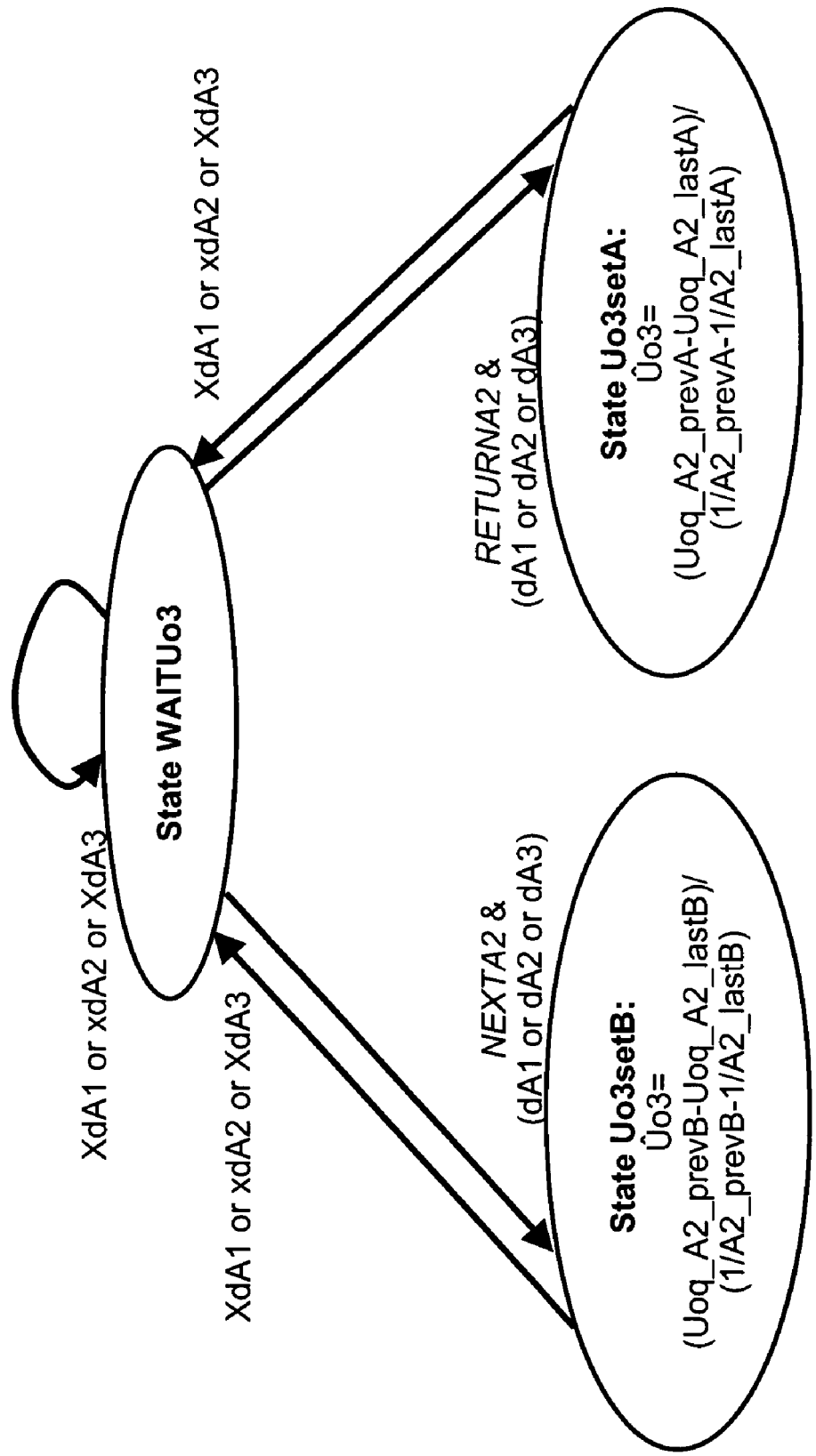
FIG. 10 is a finite state machine illustrating the determination of a second offset estimator in the receiver of FIG. 6.

FIG. 10 is a finite state machine illustrating the estimation of Uo3 by the gain and DC compensation control portion 74.

As long as none of the gain factors A1, A2 and A3 is to be changed, an estimation is not required and a state WAITUo3 is maintained.

As soon as the gain and DC compensation control portion 74 learns that one of the gain factors A1, A2, A3 is to be adjusted, it determines whether the initiation of the offset estimation calculations changed thereupon to state RETURNA2 or to state NEXTA2.

If the initiation entered the state RETURNA2, the DC offset contribution estimation for Uo3 enters the state Uo3setA. In this state, the offset contribution Uo3 is estimated to be:

$$\hat{U}o3=(Uoq\_A2\_prevA-Uoq\_A2\_lastA)/(A2\_prevA-1/A2\_lastA)$$

If the initiation entered the state NEXTA2, the DC offset contribution estimation for Uo3 enters the state Uo3setB. In this state, the offset contribution Uo3 is estimated to be:

$$\hat{U}o3=(Uoq\_A2\_prevB=Uoq\_A2\_lastB)/(1/A2\_prevB-1/A2\_lastB)$$

In both cases, the DC offset contribution estimation for Uo3 then returns to the state WAITUo3.

Figure 11:
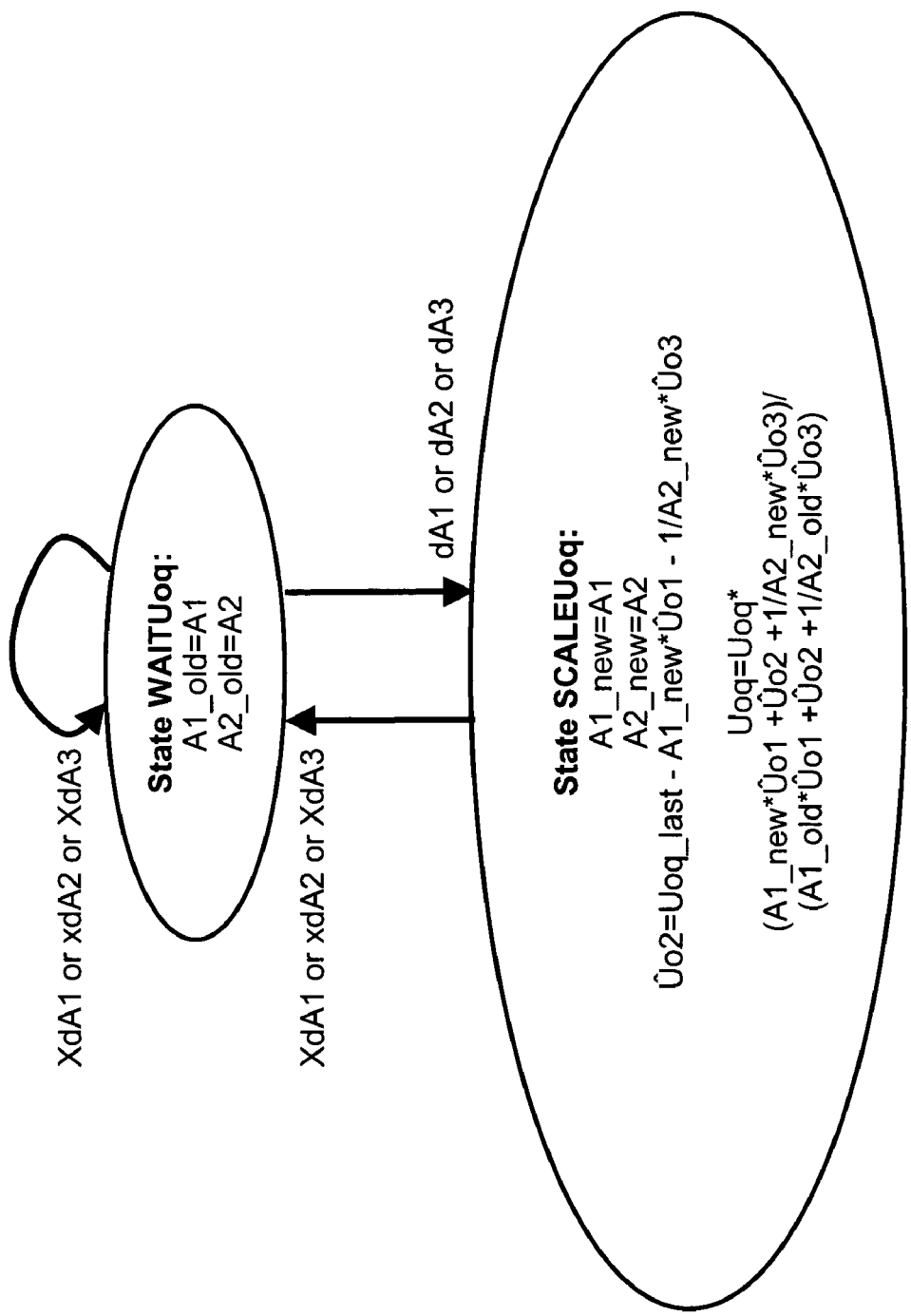
FIG. 11 is a finite state machine illustrating the determination of a third offset estimator and a scaling of a DC offset compensation quantity in the receiver of FIG. 6.

FIG. 11 is a finite state machine illustrating the estimation of Uo2 by the gain and DC compensation control portion 74 and in addition the scaling of the compensation quantity Uoq.

As long as none of the gain factors A1, A2 and A3 is to be changed, a scaling is not required and a state WAITUoq is maintained. In this state, the compensation quantity Uoq resulting in the DC estimation portion 72 in the integration is used directly for the DC offset compensation. Moreover, a variable A1_old is set to the value of gain factor A1 which is currently used and a variable A2_old is set to the value of gain factor A2 which is currently used. Thus, the variable A1_old corresponds always to variable A1_lastA or A1_lastB, whichever was updated more recently, while the variable A2_old corresponds always to variable A2_lastA or A2_lastB, whichever was updated more recently.

As soon as the gain and DC compensation control portion 74 learns that one of the gain factors A1, A2 and A3 is to be adjusted, a state SCALEUoq is entered. Actually, the state SCALEUoq has to be entered only each time any of gain factors A1 and A2 are to be changed, as a change of gain factor A3 does not have any effect on the offset compensation loop.

In the state SCALEUoq, first, a variable A1_new is set to the value of gain factor A1 which is to be used next and a variable A2_new is set to the value of gain factor A2 which is to be used next.

Then, the last DC offset contribution Uo2 is estimated to be:

$$\hat{U}o2=Uoq\_last-A1\_new*\hat{U}o1-1/A2\_new*\hat{U}o3$$

Here, Uoq_last is equal to Uoq_A1_lastA, Uoq_A1_lastB, Uoq_A2_lastA or Uoq_A2_lastB, whichever was stored last.

It has to be noted that while the DC offset contributions Uo1, Uo2, Uo3 can be estimated directly as proposed, an averaging over a plurality of preceding gain changes may be beneficial.

Based on all DC offset contribution estimates $\hat{U}o1$, $\hat{U}o2$ and $\hat{U}o3$, and in addition on the stored gain factor values, a scaling factor is then determined by the gain and DC compensation control portion as:

$$S=(A1\_new*\hat{U}o1+\hat{U}o2+1/A2\_new*\hat{U}o3)/(A1\_old*\hat{U}o1+\hat{U}o2+1/A2\_old*\hat{U}o3)$$

The determined scaling factor S is then provided by the gain and DC compensation control portion 74 to the DC estimation portion 72 for scaling the determined compensation quantity Uoq in accordance with the following equation:

$$Uoq(new)=Uoq(old)*S,$$

where Uoq(old) is the determined compensation quantity and Uoq(new) the scaled compensation quantity.

As the DC offset contribution estimates $\hat{U}o1$, $\hat{U}o2$ and $\hat{U}o3$ can be obtained during the normal receiver AGC and DC compensation operation, accurate and up-to-date values are always available, which allows a tracking of changes in the DC offset contributions to avoid DC steps.

It has to be noted that in a practical implementation, the DC offset contribution Uo3 within the compensation loop is sometimes minimal. In this case, Uoq values and gain factors have only to be stored before a respective change of gain factor A1 for an estimation of the DC offset contributions Uo1 and Uo2. The DC offset contribution Uo3 can be neglected in this case in the determination of the scaling factor S.

FIGS. 12 to 15 present simulated results of a conventional DC offset compensation and of the DC offset compensation described with reference to FIGS. 6 to 11. The simulation results were obtained in the Matlab environment.

Figure 12:
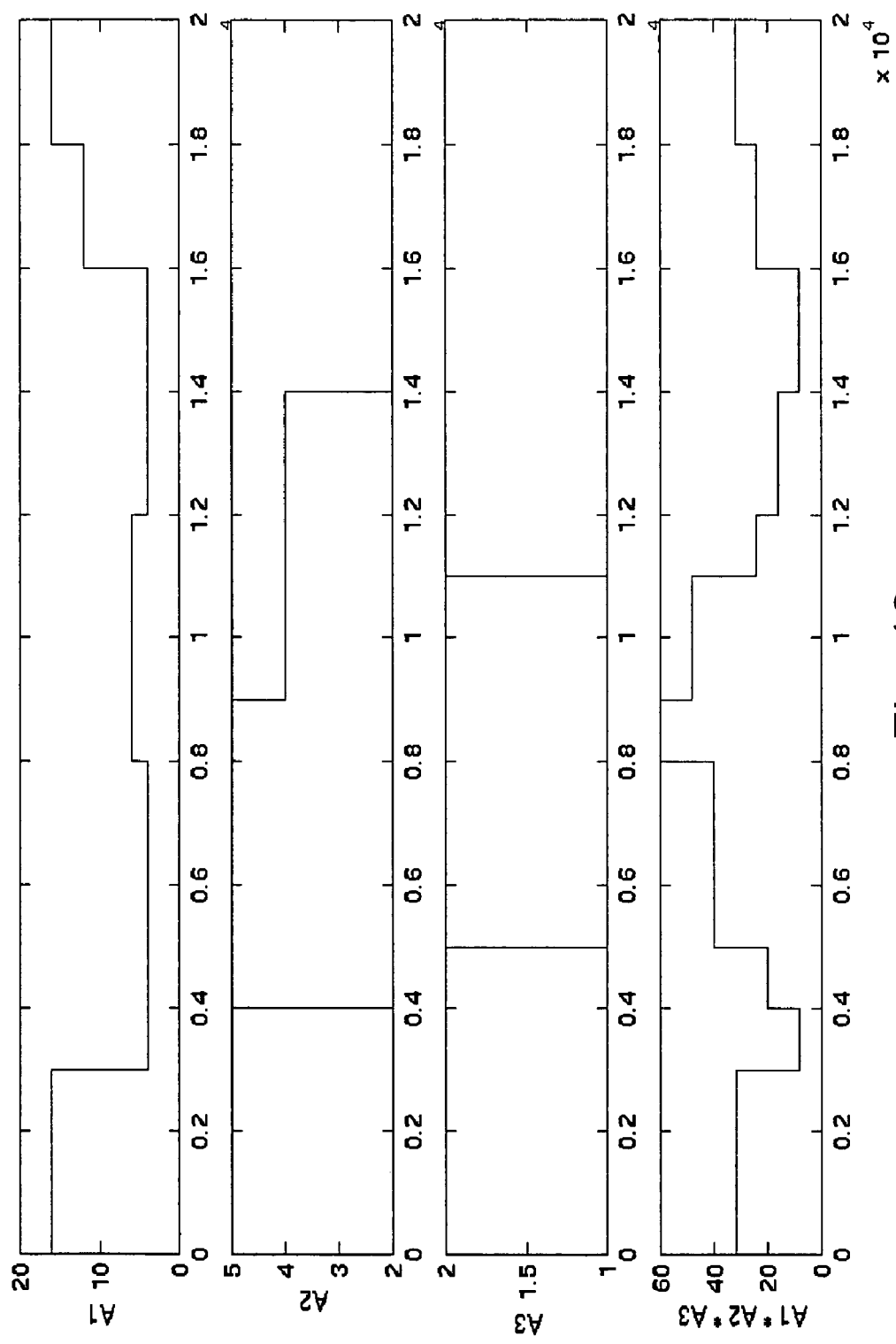
FIG. 12 presents diagrams illustrating exemplary gain sequences used as basis for simulations.

FIG. 12 presents from top to bottom a first diagram showing a gain sequence for gain factor A1, a second diagram showing a gain sequence for gain factor A2, a third diagram showing a gain sequence for gain factor A3, and a fourth diagram showing a gain sequence resulting for the entire receiving path by combining the gain factors A1*A2*A3. These gain sequences were used as basis for the simulations.

Figure 13:
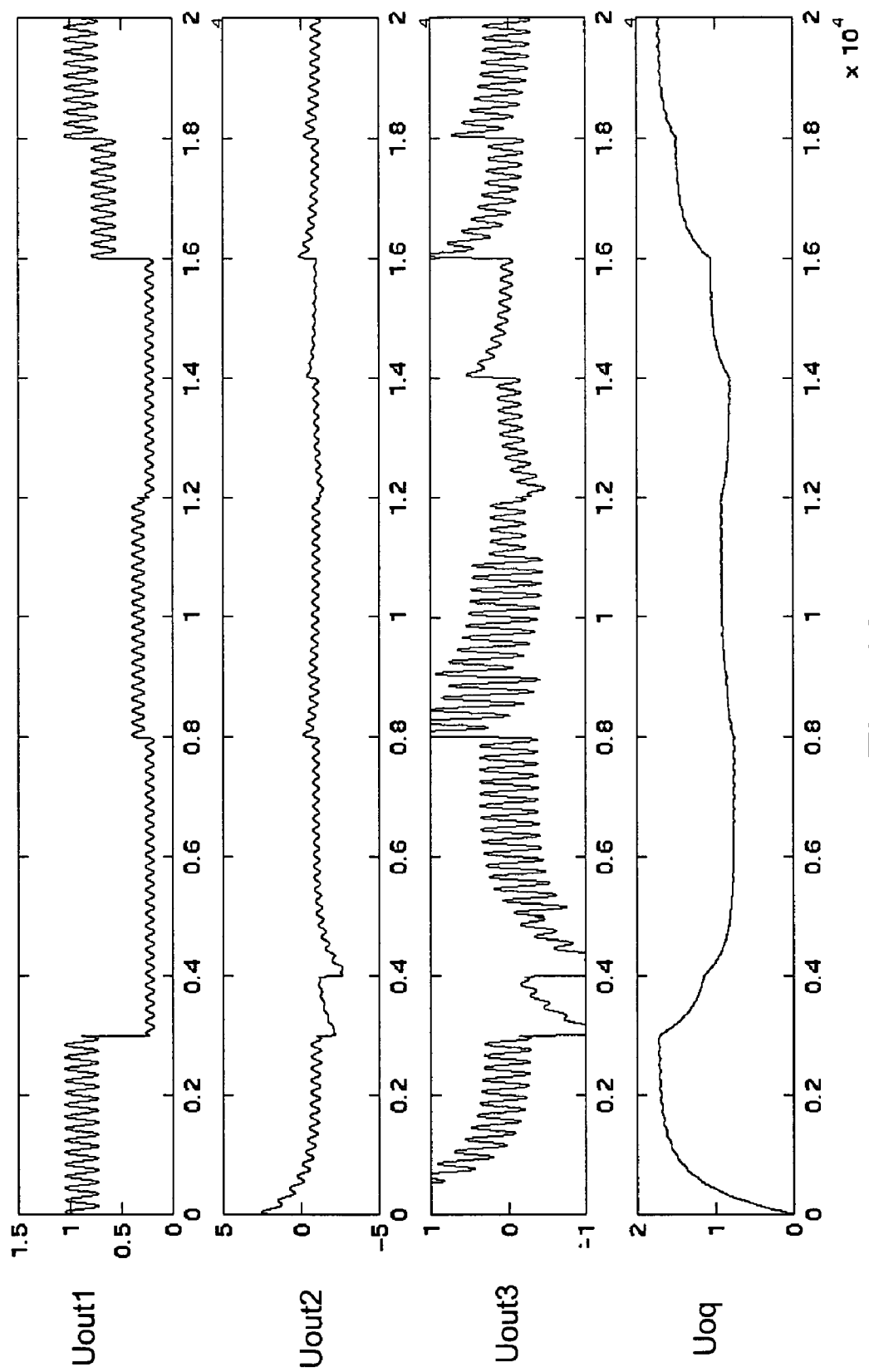
FIG. 13 presents diagrams illustrating various voltages resulting in a direct conversion receiver with a conventional DC compensation.
Figure 14:
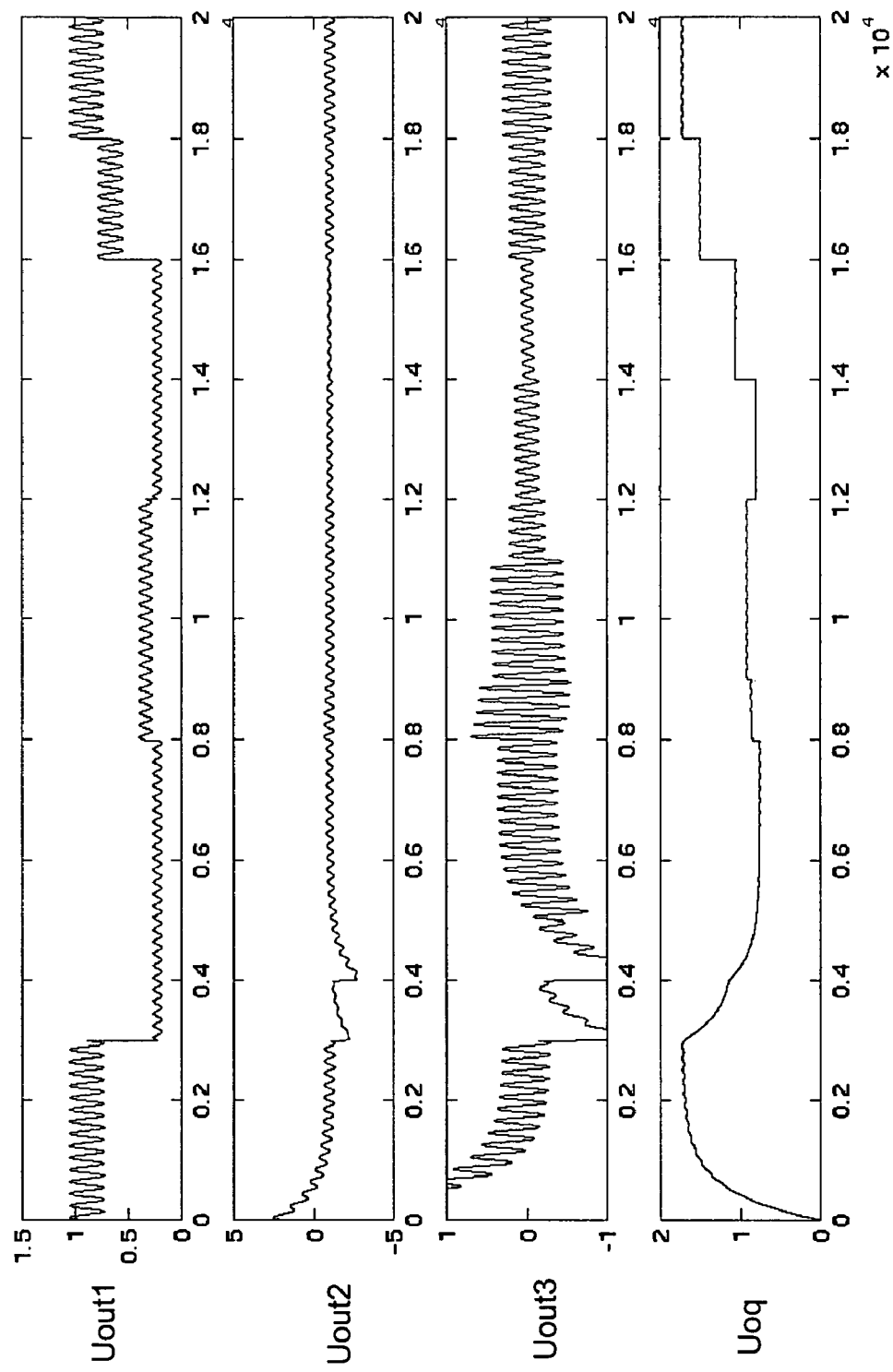
FIG. 14 presents diagrams illustrating various voltages resulting in a direct conversion receiver with a DC compensation in accordance with the invention, which starts off with uninitialized offset estimators and which results in a DC stepless operation after some gain step changes.
Figure 15:
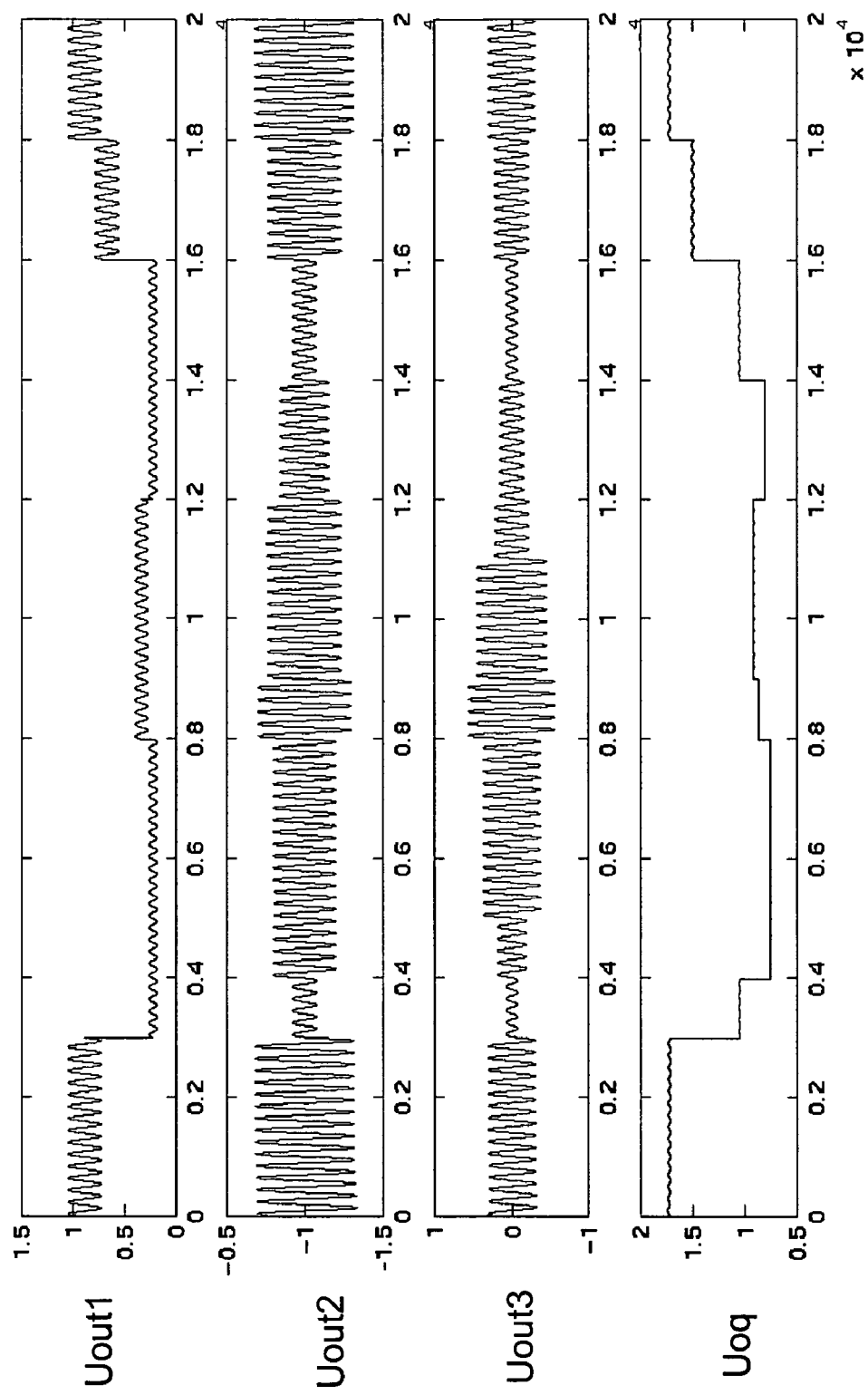
FIG. 15 presents diagrams illustrating various voltages resulting in a direct conversion receiver with a DC compensation in accordance with the invention, which employs initialized offset estimators and which results immediately in a DC stepless operation.

Each of FIGS. 13 to 15 presents from top to bottom a first diagram with the waveform of the signal Uout1=(Uin+Uo1)*A1 output by a first gain stage subject to gain. changes and baseband offset creation, corresponding to LNA and mixer 61, a second diagram with the waveform of the signal Uout2=(Uout1+Uo2)*A2 output by a first LPF stage 25/62, a third diagram with the waveform of the signal Uout3=(Uout2+Uo3)*A3 output by a second LPF stage 27/63, and a fourth diagram with the waveform of the compensation quantity Uoq output by an integrator 52/72.

FIG. 13 illustrates the time domain behavior of Uout1, Uout2, Uout3 and the compensation quantity Uoq resulting in a conventional integration based DC compensation. It can be seen that each change in each of the gain factors A1, A2 or A3 in either direction introduces a DC step and a level shift in the signal Uout3 that will settle to zero with a speed set by the integration time constant employed by the DC estimation portion 72.

FIG. 14 illustrates the time domain behavior of Uout1, Uout2, Uout3 and the compensation quantity Uoq of a integration based DC compensation in accordance with the invention. In the beginning, the estimates $\hat{U}o1$, $\hat{U}o2$ and $\hat{U}o3$ do not have correct values yet, as preceding gain factors and Uoq values are not available for determining the estimates. Thus, no correct scaling can be made from the beginning. As a result, DC steps and an integrator settling will result for the first few gain steps, just as in the conventional DC offset compensation. However, when the gain factors have been changed at least once, the estimates $\hat{U}o1$, $\hat{U}o2$ and $\hat{U}o3$ can be calculated and used in scaling the compensation quantity Uoq for a DC stepless operation. It can be seen that towards the end of FIG. 14, the algorithm has been able to find the estimates and no DC steps occur anymore in the signal Uout3. Thereby, FIG. 14 also shows the capability of initializing the offset estimates for a further improved compensation.

FIG. 15 illustrates further the time domain behavior of Uout1, Uout2, Uout3 and the compensation quantity Uoq of a integration based DC compensation in accordance with the invention. In this case, however, the DC offset contribution estimates $\hat{U}o1$, $\hat{U}o2$ and $\hat{U}o3$ are initialized by suitable values. As a result, a completely DC stepless operation is achieved.

The presented scaling principle scales dominant state variables of the DC compensation system. In addition to the presented scaling, it is also possible to scale the state variables of the analogue base-band filter whenever a gain step in gain factors A1, A2 or A3 is executed. This is useful and avoids ringing in case the order of the analogue filter is high. In case of a low order filter, however, no ringing is expected and a scaling of the filter state variable is not necessary, as in the presented simulation example.

It has to be noted that the normalization with 1/(A2*A3) is also suited by itself, that is without subsequent scaling of the compensation quantity Uoq, to desensitize the DC compensation loop and the AGC scheme from influences by DC offset contribution Uo2. When assuming, for example, that DC offset contribution Uo2 is the only or a strongly dominant offset source, then no DC step and new settling would result after a gain change, as the compensation quantity Uoq does not have to be changed. If no normalization and no scaling is performed, a DC step would result at the output of the analog-to-digital converter 64 every time the gain of the signal path is changed, and the DC compensation loop would need to settle to a new compensation value, possibly resulting in a loss of signal or in a phase shift, etc.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method comprising:

determining an amount of a direct-current offset present at a selected end point in a receiving path of a receiver, in which receiving path at least one gain factor is adjustable by a gain control, and setting a compensation quantity accordingly;

exclusively in the case of a forthcoming adjustment of said at least one gain factor by said gain control, scaling said compensation quantity with a scaling factor to prevent a direct-current step at said selected end point due to said forthcoming adjustment of said at least one gain factor; and feeding said compensation quantity at a selected summing node into said receiving path to compensate for a direct-current offset coupled into said receiving path, wherein said direct-current offset comprises at least a first contribution and a second contribution, said first contribution being multiplied on said receiving path at least by a first adjustable gain factor and said second contribution being multiplied on said receiving path by a second adjustable gain factor, wherein said first contribution and said second contribution are estimated, and wherein said scaling factor is determined based on said estimated first contribution, said estimated second contribution and said forthcoming adjustment of said at least one gain factor.

2. The method according to claim 1, further comprising determining said scaling factor by:

estimating a current amount of contributions to said direct-current offset;

determining a relative change in said direct-current offset which would have resulted with said estimated amount of direct-current contributions after a preceding gain adjustment; and selecting said relative change as scaling factor.

3. The method according to claim 1, further comprising a preceding step of normalizing a signal provided at said selected end point of said receiving path by dividing said signal by a total gain applied by said receiving path between said summing node and said end point of said receiving path, wherein said normalized signal is used for determining said amount of a direct-current offset.

4. The method according to claim 3, wherein said first contribution enters said receiving path between said summing node and said end point, wherein said first contribution is multiplied on said receiving path by a first gain factor A3, wherein said second contribution enters said receiving path at said summing node, wherein said second contribution is multiplied on said receiving path by said first gain factor and in addition by a second gain factor A2, and wherein said direct-current offset comprises a third contribution entering said receiving path before said summing node, which third contribution is multiplied on said receiving path by said first gain factor, by said second gain factor and in addition by a third gain factor A1;

wherein Uoq_A1_last is said compensation quantity before a gain adjustment of gain factor A1 from A1_last to A1_new and wherein Uoq_A1_prev is said compensation quantity before a preceding gain adjustment of gain factor A1 from A1_prev to A1_last;

wherein Uoq_A2_last is said compensation quantity before a gain adjustment of gain factor A2 to from A2_last to A2_new and wherein Uoq_A2_prev is said compensation quantity before a preceding gain adjustment of gain factor A2 from A2_prev to A2_last;

wherein said first contribution is estimated to be Üo3=(Uoq_A2_prev−Uoq_A2_last)/(1/A2_prev−1/A2_last);

wherein said third contribution is estimated to be Üo1=(Uoq_A1_prev−Uoq_A1_last)/(A1_prev−A1_last);

wherein said second contribution is estimated to be Üo2=Uoq_last−A1_new*Üo1−1/A2_new*Üo3; and wherein said scaling factor is determined to be S=(A1_new*Üo1+Üo2+1/A2_new*Üo3)/(A1_last*Üo1+Üo2+1/A2_last*Üo3).

5. The method according to claim 1, wherein determining said amount of a direct-current offset at said end point of said receiving path comprises at least one of integrating a signal available at said end point of said receiving path, windowing a signal available at said end point of said receiving path, detecting positive and negative peaks in a signal available at said end point of said receiving path, and envelope forming of a signal available at said end point of said receiving path.

6. The method according to claim 1, wherein said compensation quantity is determined and scaled in the digital domain, a respective final compensation quantity being converted into the analog domain before it is fed to said summing node.

7. The method according to claim 1, wherein said receiver is a direct conversion radio frequency receiver.

8. An apparatus comprising:

a direct-current estimation portion adapted to estimate an amount of a direct-current offset present at a selected end point in a receiving path, in which receiving path at least one gain factor is adjustable by a gain control, adapted to set a compensation quantity accordingly, adapted to scale said compensation quantity with a provided scaling factor, if any, and adapted to feed said compensation quantity into said receiving path at a selected summing node to compensate for a direct-current offset coupled into said receiving path; and a direct-current compensation control portion adapted to determine exclusively in the case of a forthcoming adjustment of said at least one gain factor a scaling factor preventing a direct-current step at said selected end point due to said forthcoming adjustment of said at least one gain factor, and adapted to provide said scaling factor to said direct-current estimation portion, wherein said direct-current offset comprises at least a first contribution and a second contribution, said first contribution being multiplied on said receiving path at least by a first adjustable gain factor and said second contribution being multiplied on said receiving path by a second adjustable gain factor, wherein said first contribution and said second contribution are estimated, and wherein said scaling factor is determined based on said estimated first contribution, said estimated second contribution and said forthcoming adjustment of said at least one gain factor.

9. The apparatus according to claim 8, wherein said direct-current compensation control portion is adapted to determine said scaling factor by:

estimating a current amount of contributions to said direct-current offset;

determining a relative change in said direct-current offset which would have resulted with said estimated amount of direct-current contributions after a preceding gain adjustment; and selecting said relative change as said scaling factor.

10. The apparatus according to claim 8, further comprising a normalization portion adapted to normalize a signal provided at said selected end point of said receiving path by dividing said signal by a total gain applied by said receiving path between said summing node and said end point of said receiving path, which normalization portion is arranged for providing said normalized signal to said direct-current estimation portion as basis for determining said amount of a direct-current offset.

11. The apparatus according to claim 8, wherein said direct-current estimation portion comprises an integrator for determining said amount of a direct-current offset at said end point of said receiving path by integrating a signal output at said end point.

12. The apparatus according to claim 8, wherein said receiving path comprises an analog-to-digital converter, wherein said selected end point corresponds to the output of said analog-to-digital converter, and wherein said direct-current estimation portion and said direct-current compensation control portion are adapted to operate in the digital domain, said apparatus further comprising a digital-to-analog converter arranged for converting a final digital compensation quantity provided by said direct current estimation portion into the analog domain before feeding it to said summing node.

13. The apparatus according to claim 8, wherein said apparatus is a direct conversion receiver.

14. The apparatus according to claim 8, further comprising said receiving path.

15. The apparatus according to claim 8, wherein said apparatus is a receiver.

16. An electronic device including a receiver, which receiver comprises:
   a receiving path, in which receiving path at least one gain factor is adjustable by a gain control, wherein a direct-current offset coupled into said receiving path is to be compensated;
   a direct-current estimation portion adapted to determine an amount of said direct-current offset present at a selected end point in said receiving path, adapted to set a compensation quantity accordingly, adapted to scale said compensation with a provided scaling factor, if any, and adapted to feed said compensation quantity at a selected summing node into said receiving path; and
   a direct current compensation control portion adapted to determine exclusively in the case of a forthcoming adjustment of said at least one gain factor a scaling factor preventing a direct-current step at said selected end point due to said forthcoming adjustment of said at least one gain factor, and adapted to provide said scaling factor to said direct-current estimation portions,
   wherein said direct-current offset comprises at least a first contribution and a second contribution, said first contribution being multiplied on said receiving path at least by a first adiustable gain factor and said second contribution being multiplied on said receiving path by a second adiustable gain factor,
   wherein said first contribution and said second contribution are estimated, and
   wherein said scaling factor is determined based on said estimated first contribution, said estimated second contribution and said forthcoming adiustment of said at least one gain factor.

17. The electronic device according to claim 16, wherein said direct-current compensation control portion is adapted to determine said scaling factor by:
   estimating a current amount of contributions to said direct-current offset;
   determining a relative change in said direct-current offset which would have resulted with said estimated amount of direct-current contributions after a preceding gain adjustment; and
   selecting said relative change as said scaling factor.

18. The electronic device according to claim 16, wherein said receiver further comprises a normalization portion adapted to normalize a signal provided at said selected end point of said receiving path by dividing said signal by a total gain applied by said receiving path between said summing node and said end point of said receiving path, which normalization portion is arranged for providing said normalized signal to said direct-current estimation portion as basis for determining said amount of a direct-current offset.

19. The electronic device according to claim 16, wherein said direct-current estimation portion comprises an integrator for determining said amount of a direct-current offset at said end point of said receiving path by integrating a signal output at said end point.

20. The electronic device according to claim 16, wherein said receiving path comprises an analog-to-digital converter, wherein said selected end point corresponds to the output of said analog-to-digital converter, and wherein said direct-current estimation portion and said direct-current compensation control portion are adapted to operate in the digital domain, said receiver further comprising a digital-to-analog converter arranged for converting a final digital compensation quantity provided by said direct-current estimation portion into the analog domain before feeding it to said summing node.

21. The electronic device according to claim 16, wherein said receiver is a direct conversion receiver.

22. A hardware component for a receiver comprising a receiving path, in which receiving path at least one gain factor is adjustable by a gain control, wherein a direct-current offset coupled into said receiving path is to be compensated, said hardware component comprising:
   a direct-current estimation portion adapted to estimate an amount of said direct-current offset present at a selected end point in said receiving path, adapted to set a compensation quantity accordingly, adapted to scale said compensation quantity with a provided scaling factor, if any, and adapted to feed said compensation quantity into said receiving path at a selected summing node; and
   a direct-current compensation control portion adapted to determine exclusively in the case of a forthcoming adjustment of said at least one gain factor a scaling factor preventing a direct-current step at said selected end point due to said forthcoming adjustment of said at least one gain factor, and adapted to provide said scaling factor to said direct-current estimation portion,
   wherein said direct-current offset comprises at least a first contribution and a second contribution, said first contribution being multiplied on said receiving path at least by a first adjustable gain factor and said second contribution being multiplied on said receiving oath by a second adjustable gain factor,
   wherein said first contribution and said second contribution are estimated. and
   wherein said scaling factor is determined based on said estimated first contribution, said estimated second contribution and said forthcoming adjustment of said at least one gain factor.

23. A software program product comprising a computer readable medium in which a software code is stored, said software code realizing the following when being executed:
   determining an amount of a direct-current offset present at a selected end point in a receiving path, in which receiving path at least one gain factor is adjustable by a gain control, and setting a compensation quantity accordingly;
   exclusively in the case of a forthcoming adjustment of said at least one gain factor by said gain control, scaling said compensation quantity with a scaling factor to prevent a direct-current step at said selected end point due to said forthcoming adjustment of said at least one gain factor; and
   providing said compensation quantity for feeding into said receiving path at a selected summing node to compensate for a direct-current offset coupled into said receiving paths,
   wherein said direct-current offset comprises at least a first contribution and a second contribution, said first contribution being multiplied on said receiving path at least by a first adjustable gain factor and said second contribution being multiplied on said receiving path by a second adjustable gain factor, wherein said first contribution and said second contribution are estimated, and wherein said scaling factor is determined based on said estimated first contribution, said estimated second contribution and said forthcoming adjustment of said at least one gain factor.

24. An apparatus comprising:

means for determining an amount of a direct-current offset present at a selected end point in a receiving path of a receiver, in which receiving path at least one gain factor is adjustable by a gain control, and setting a compensation quantity accordingly;

means for scaling said compensation quantity with a scaling factor exclusively in the case of a forthcoming adjustment of said at least one gain factor by said gain control to prevent a direct-current step at said selected end point due to said forthcoming adjustment of said at least one gain factor; and means for feeding said compensation quantity at a selected summing node into said receiving path to compensate for a direct-current offset coupled into said receiving path, wherein said direct-current offset comprises at least a first contribution and a second contribution, said first contribution being multiplied on said receiving path at least by a first adjustable gain factor and said second contribution being multiplied on said receiving path by a second adjustable pain factor, wherein said first contribution and said second contribution are estimated, and wherein said scaling factor is determined based on said estimated first contribution, said estimated second contribution and said forthcoming adjustment of said at least one gain factor.

25. The apparatus according to claim 24, further comprising means for normalizing a signal provided at said selected end point of said receiving path by dividing said signal by a total gain applied by said receiving path between said summing node and said end point of said receiving path, and for providing said normalized signal to said means for determining an amount of a direct-current offset as basis for determining said amount of a direct-current offset.

* * * * *

UNITED STATES PATENT AND TRADEMARK OFFICE
CERTIFICATE OF CORRECTION

PATENT NO. : 7,336,937 B2
APPLICATION NO. : 10/839725
DATED : February 26, 2008
INVENTOR(S) : Tervaluoto et al.

It is certified that error appears in the above-identified patent and that said Letters Patent is hereby corrected as shown below:

In column 16, line 27, claim 8, line 22 "adiustable" should be -- adjustable --
In column 17, line 29, claim 16, line 20 "portions" should be -- portion --
In column 18, line 36, claim 22, line 25 "oath" should be -- path --
In column 18, line 39, claim 22, line 28 after "estimated" "." should be -- , --

Signed and Sealed this

First Day of July, 2008

JON W. DUDAS
*Director of the United States Patent and Trademark Office*